(12) United States Patent
Suzuki et al.

(10) Patent No.: US 6,720,234 B2
(45) Date of Patent: Apr. 13, 2004

(54) SEMICONDUCTOR INTEGRATED CIRCUIT DEVICE AND METHOD OF MANUFACTURING INVOLVING THE SCALE-DOWN WIDTH OF SHALLOW GROOVE ISOLATION USING ROUND PROCESSING

(75) Inventors: Norio Suzuki, Mito (JP); Hiroyuki Ichizoe, Mizuho (JP); Masayuki Kojima, Kokubunji (JP); Keiji Okamoto, Higashiyamato (JP); Shinichi Horibe, Hachiouji (JP); Kozo Watanabe, Kokubunji (JP); Yasuko Yoshida, Sayama (JP); Shuji Ikeda, Koganei (JP); Akira Takamatsu, Hamura (JP); Norio Ishitsuka, Chiyoda (JP); Atsushi Ogishima, Tachikawa (JP); Maki Shimoda, Hachiouji (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/366,423

(22) Filed: Feb. 14, 2003

(65) Prior Publication Data

US 2003/0148587 A1 Aug. 7, 2003

Related U.S. Application Data

(63) Continuation of application No. 09/889,018, filed as application No. PCT/JP99/06936 on Dec. 10, 1999, now Pat. No. 6,562,695.

(30) Foreign Application Priority Data

Mar. 3, 1999 (JP) .......................................... 11-055529

(51) Int. Cl.⁷ .............................................. H01L 21/76
(52) U.S. Cl. ....................................... 438/424; 438/427
(58) Field of Search ................................. 438/424, 425, 438/426, 427, 431, 197, 221, 229, 230, 294, 296, 299, 303, 778

(56) References Cited

U.S. PATENT DOCUMENTS

| 5,674,775 A | 10/1997 | Ho et al. ...................... 438/296 |
| 6,238,999 B1 | 5/2001 | Dickerson et al. .......... 257/510 |

FOREIGN PATENT DOCUMENTS

| JP | 2-260660 | 10/1990 |
| JP | 4-303942 | 10/1992 |
| JP | 8-97277 | 4/1996 |
| JP | 10-144886 | 5/1998 |
| JP | 11-17139 | 1/1999 |
| JP | 11-74475 | 3/1999 |
| JP | 11-97648 | 4/1999 |
| JP | 2000-31264 | 1/2000 |
| JP | 2000-68367 | 3/2000 |

OTHER PUBLICATIONS

Yeh et al., "A Novel Shallow Trench Isolation with Mini-Spacer Technology" Extended Abstracts of the 1998 Int'l Conference on Solid State Devices and Materials, Hiroshima, 1998, pp. 98–99.

Primary Examiner—Michael S. Lebentritt
Assistant Examiner—Beth E. Owens
(74) Attorney, Agent, or Firm—Antonelli, Terry, Stout & Kraus, LLP

(57) ABSTRACT

Grooves are defined in a substrate having device isolation regions by dry etching using silicon nitride films and side wall spacers as masks. Thereafter, the side wall spacers lying on side walls of the silicon nitride films are removed and the substrate is subjected to thermal oxidation, whereby the surface of the substrate at a peripheral portion of each active region is subjected to so-called round processing so as to have a sectional shape having a convex rounded shape.

28 Claims, 35 Drawing Sheets

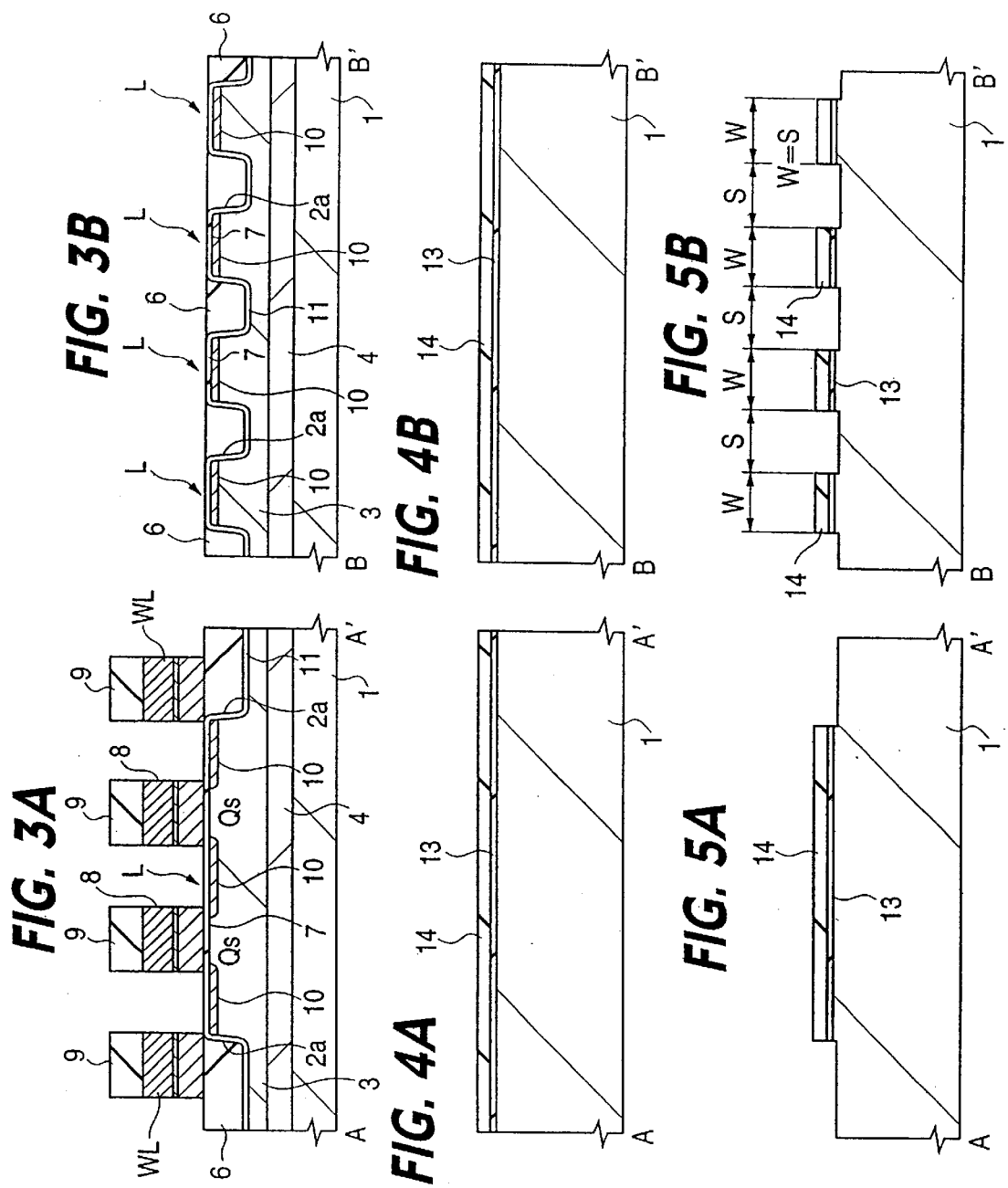

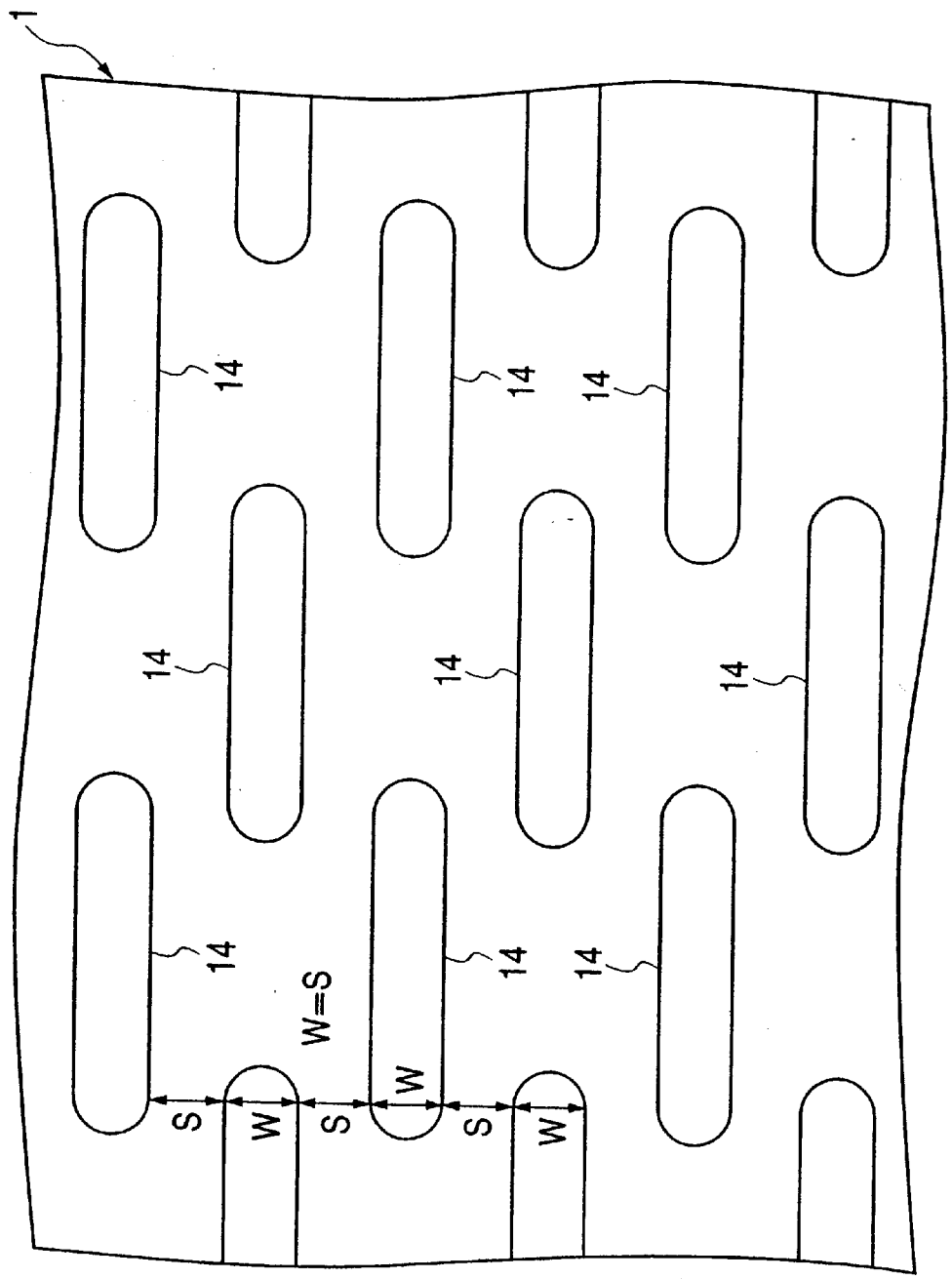

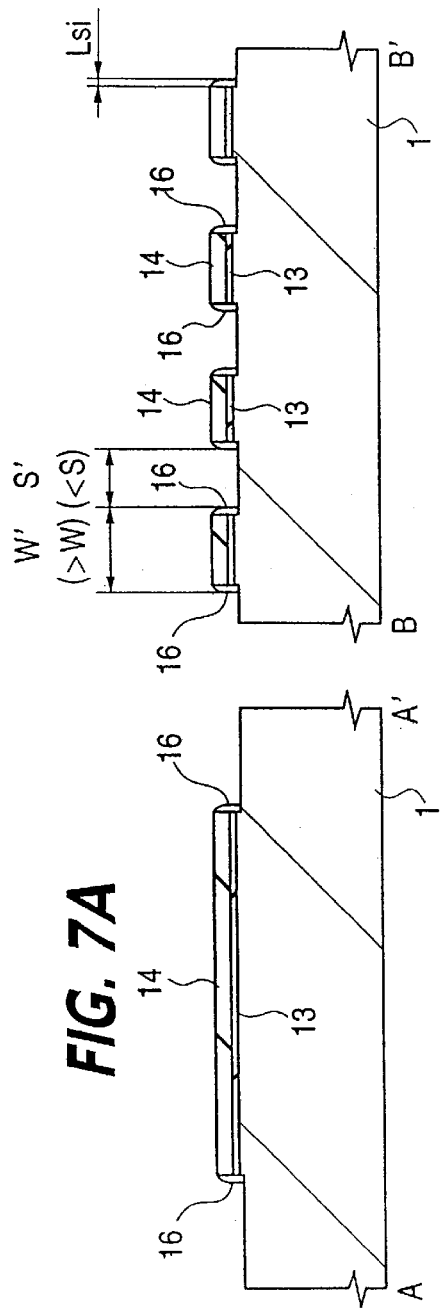

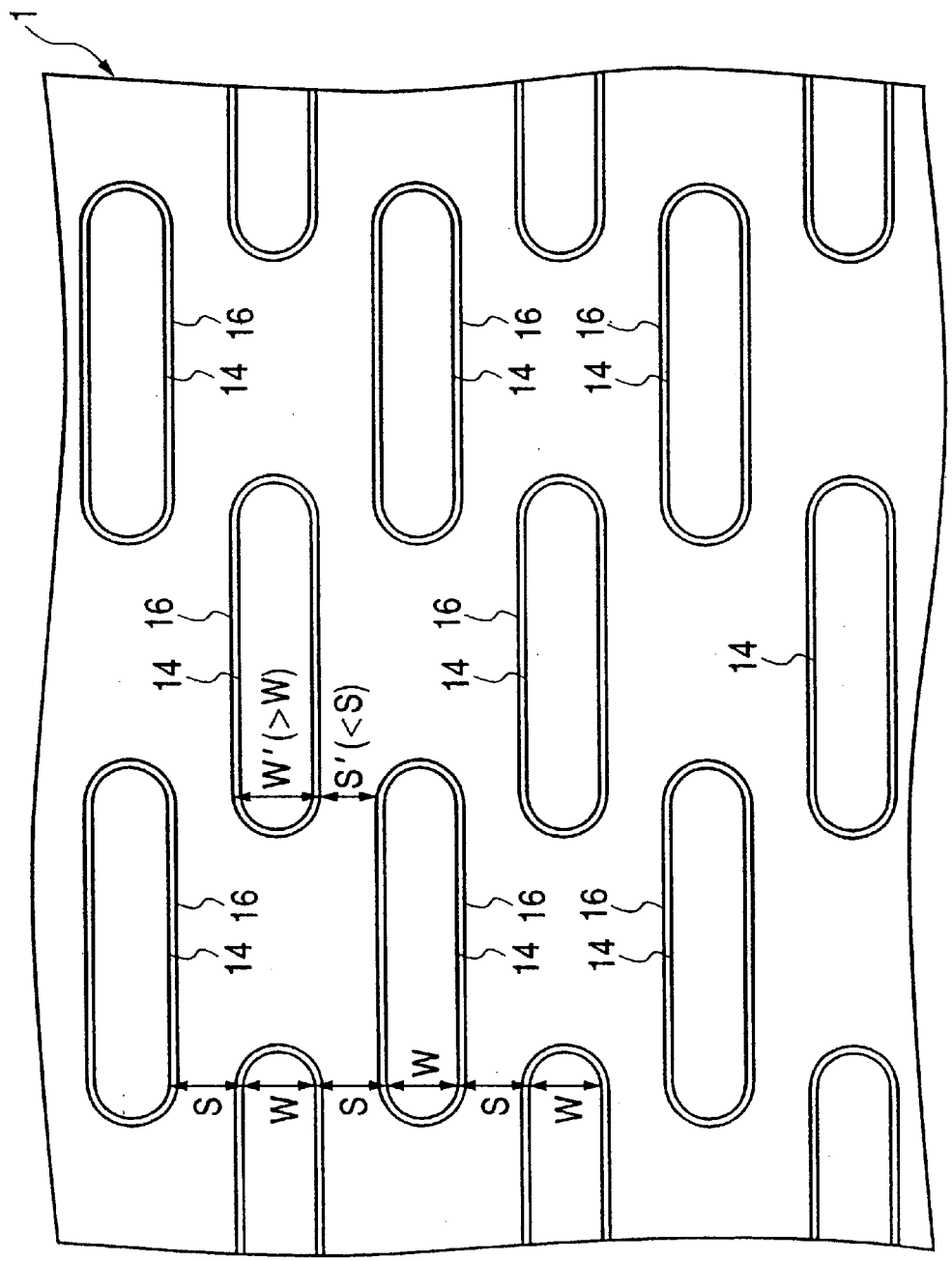

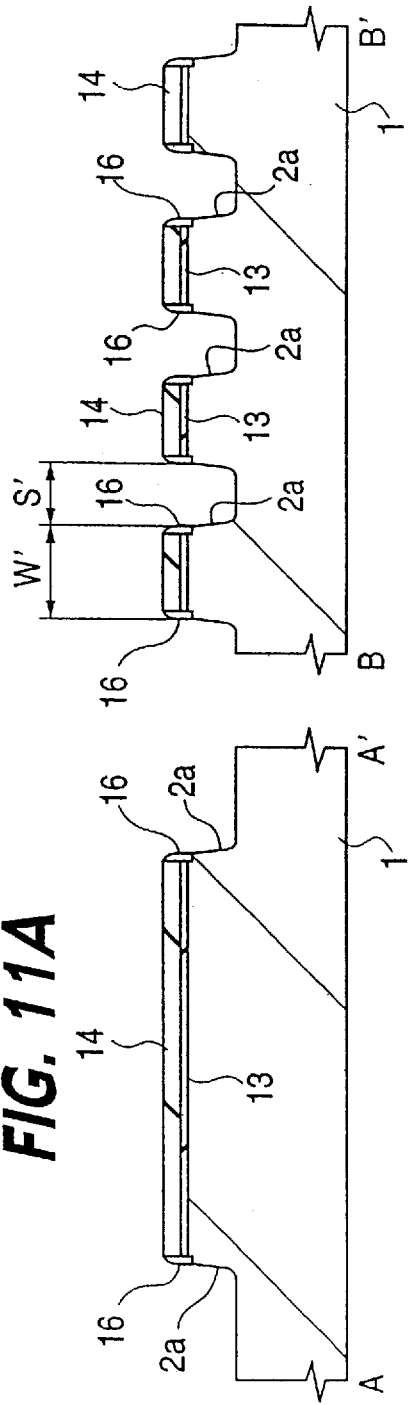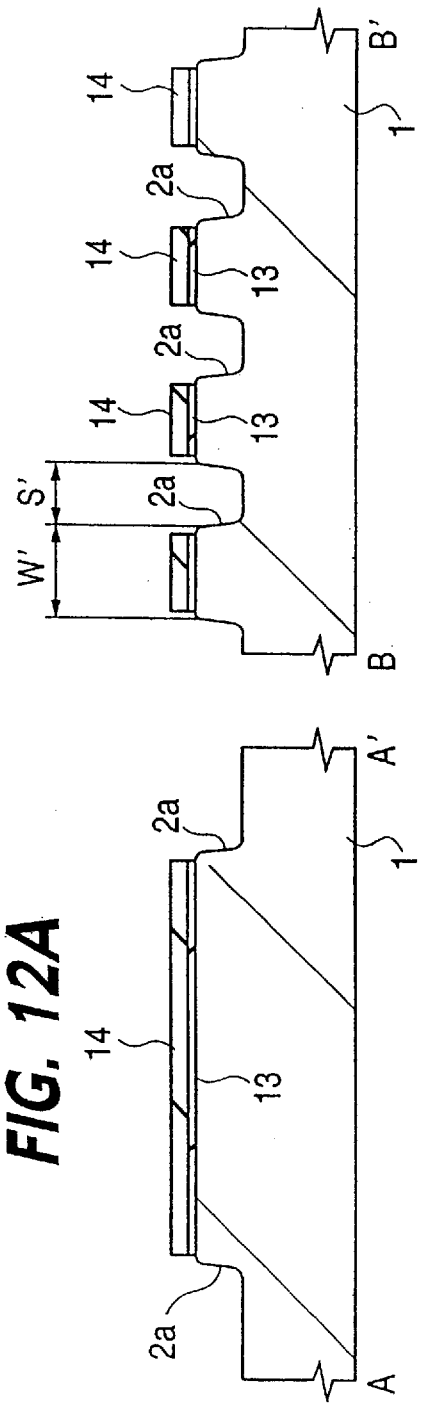

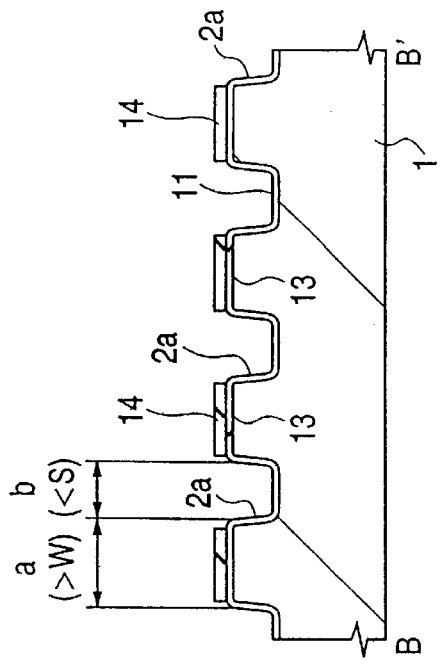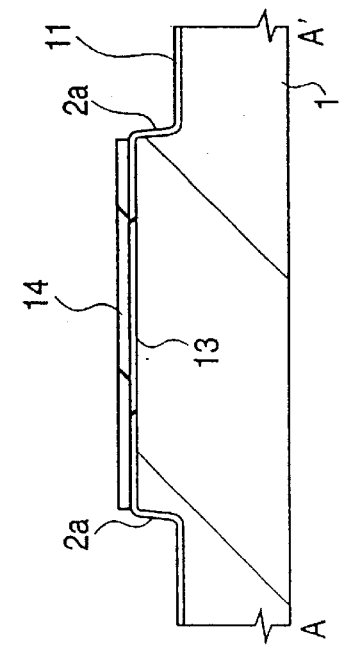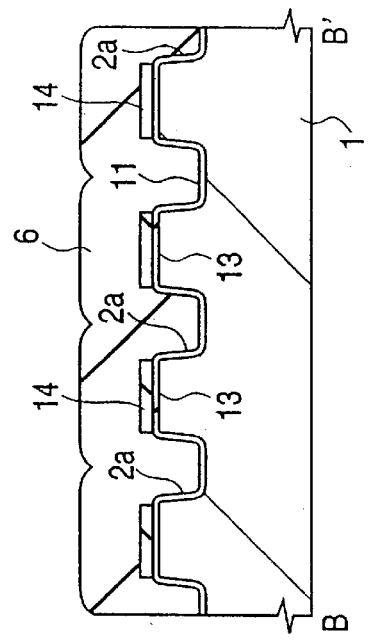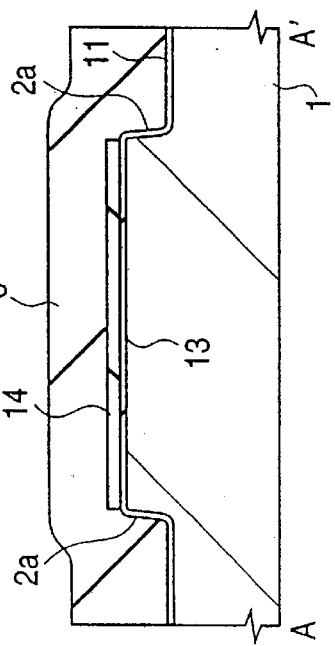

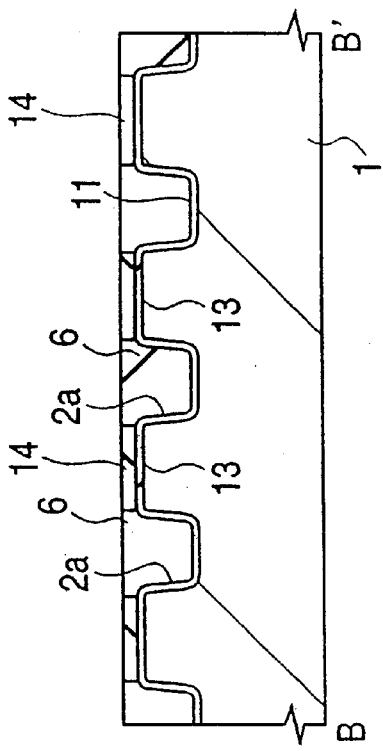
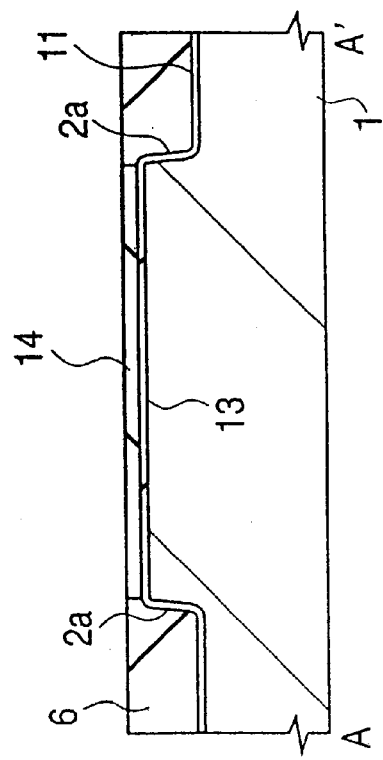
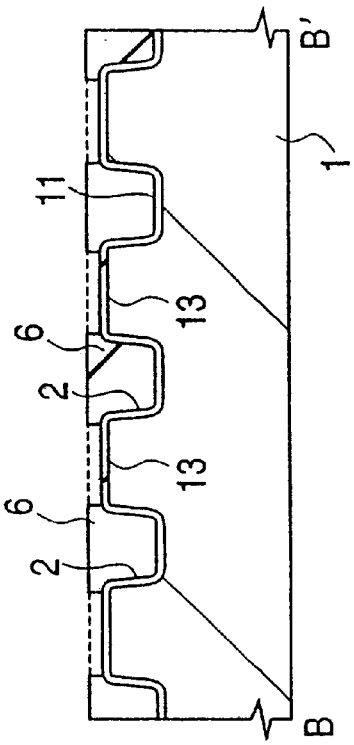
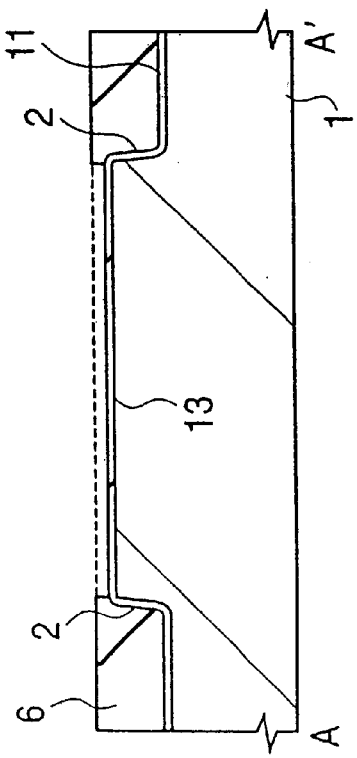

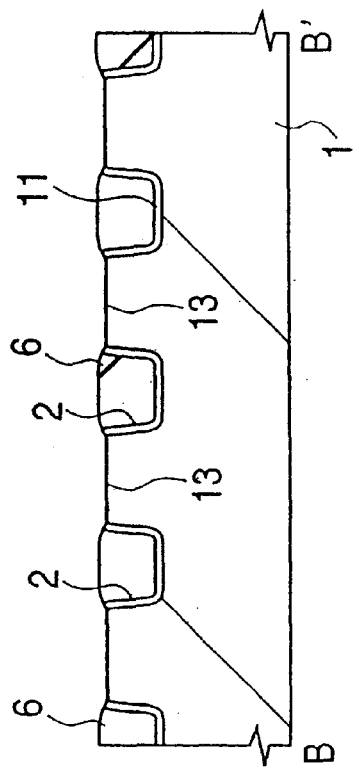
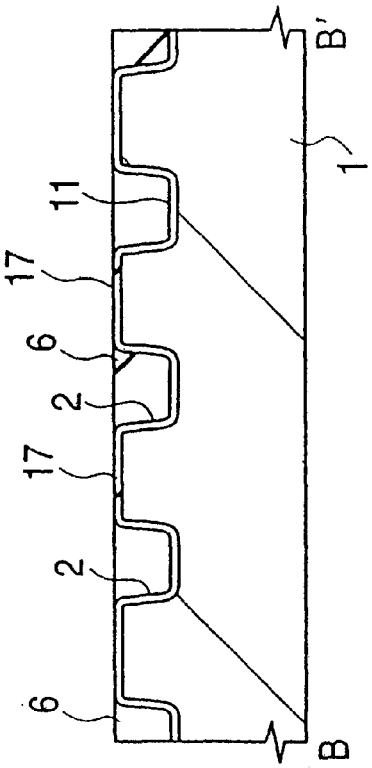
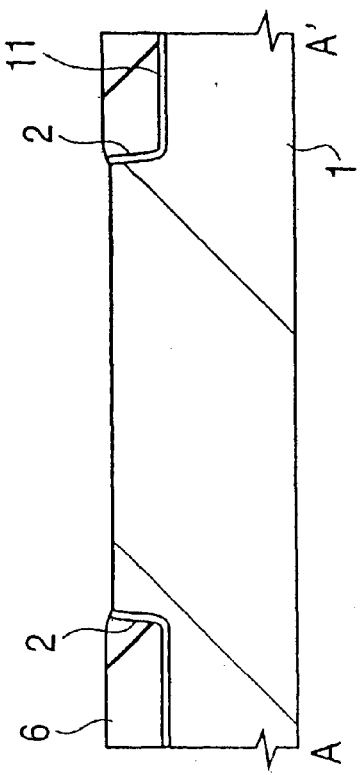
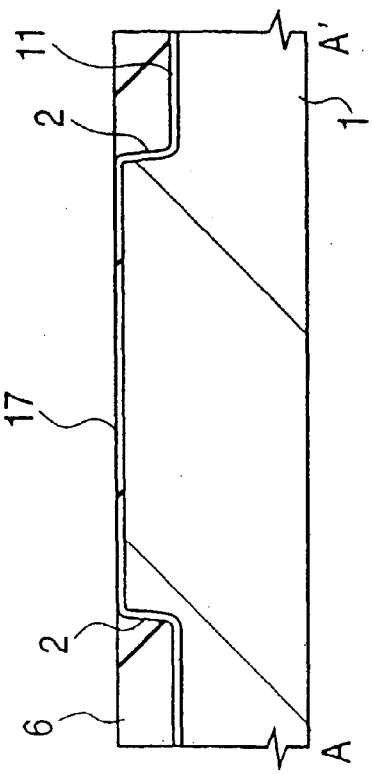

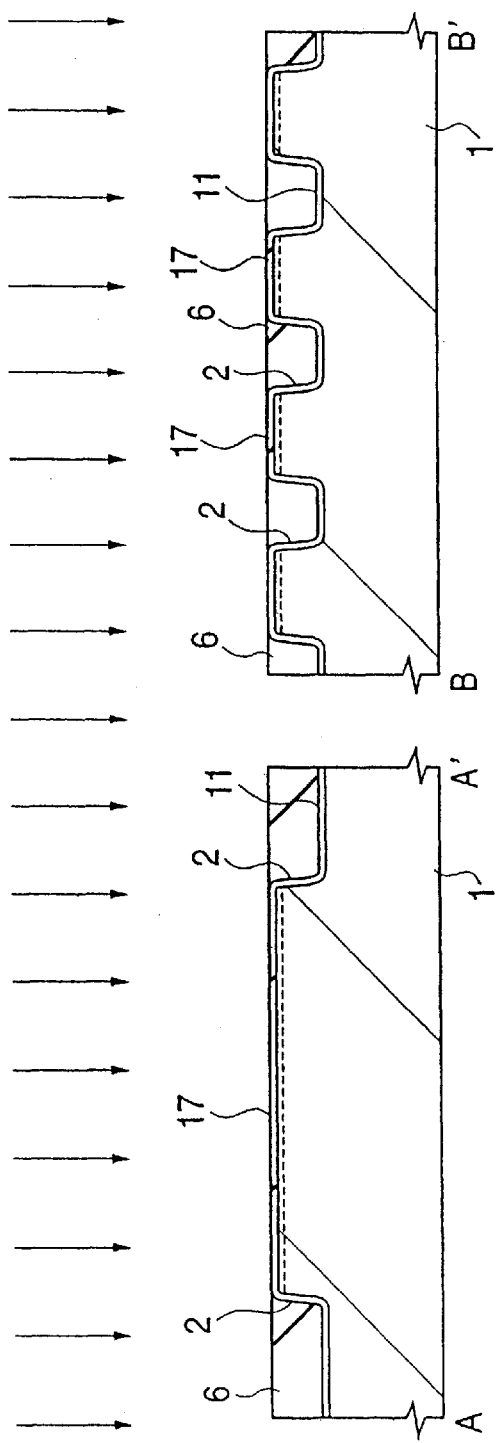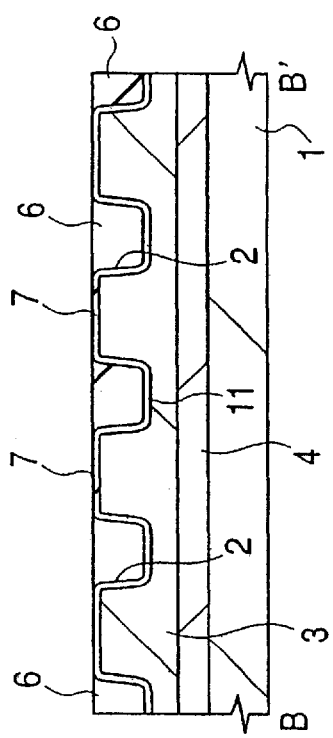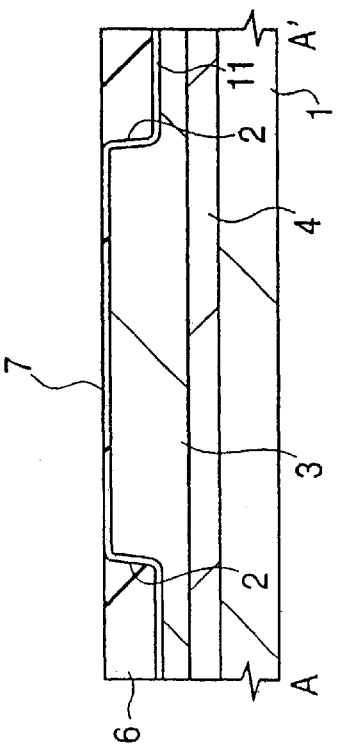

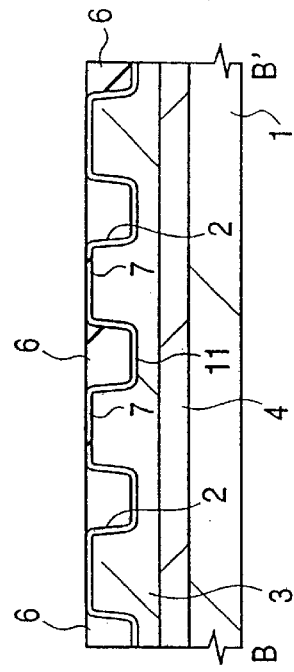
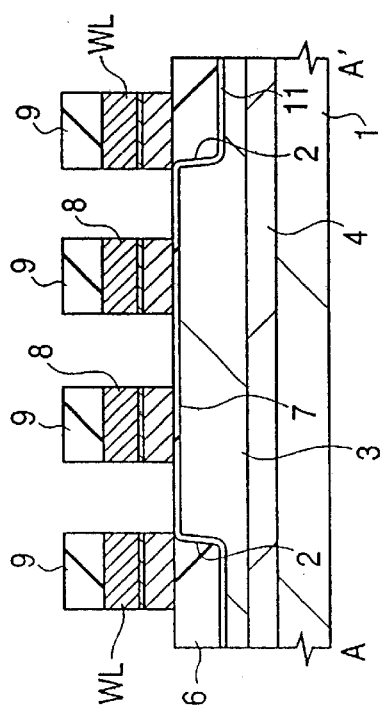
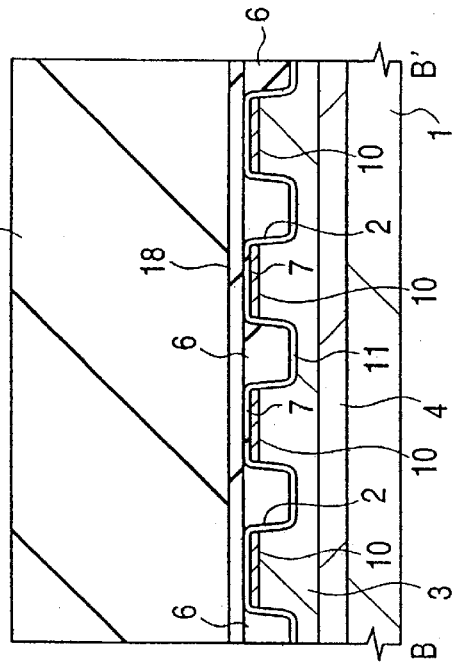
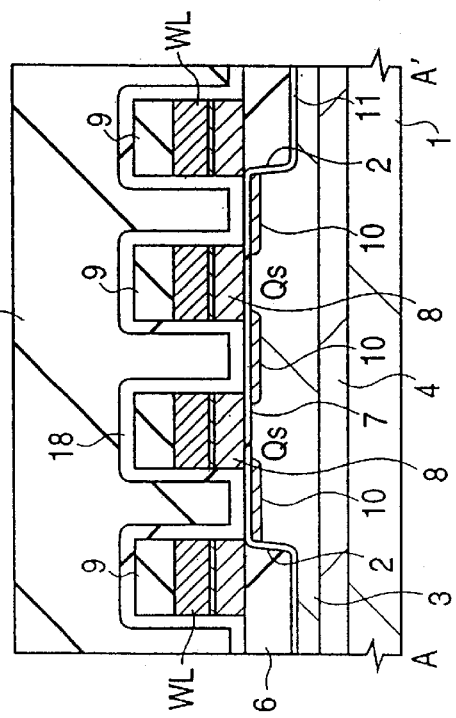

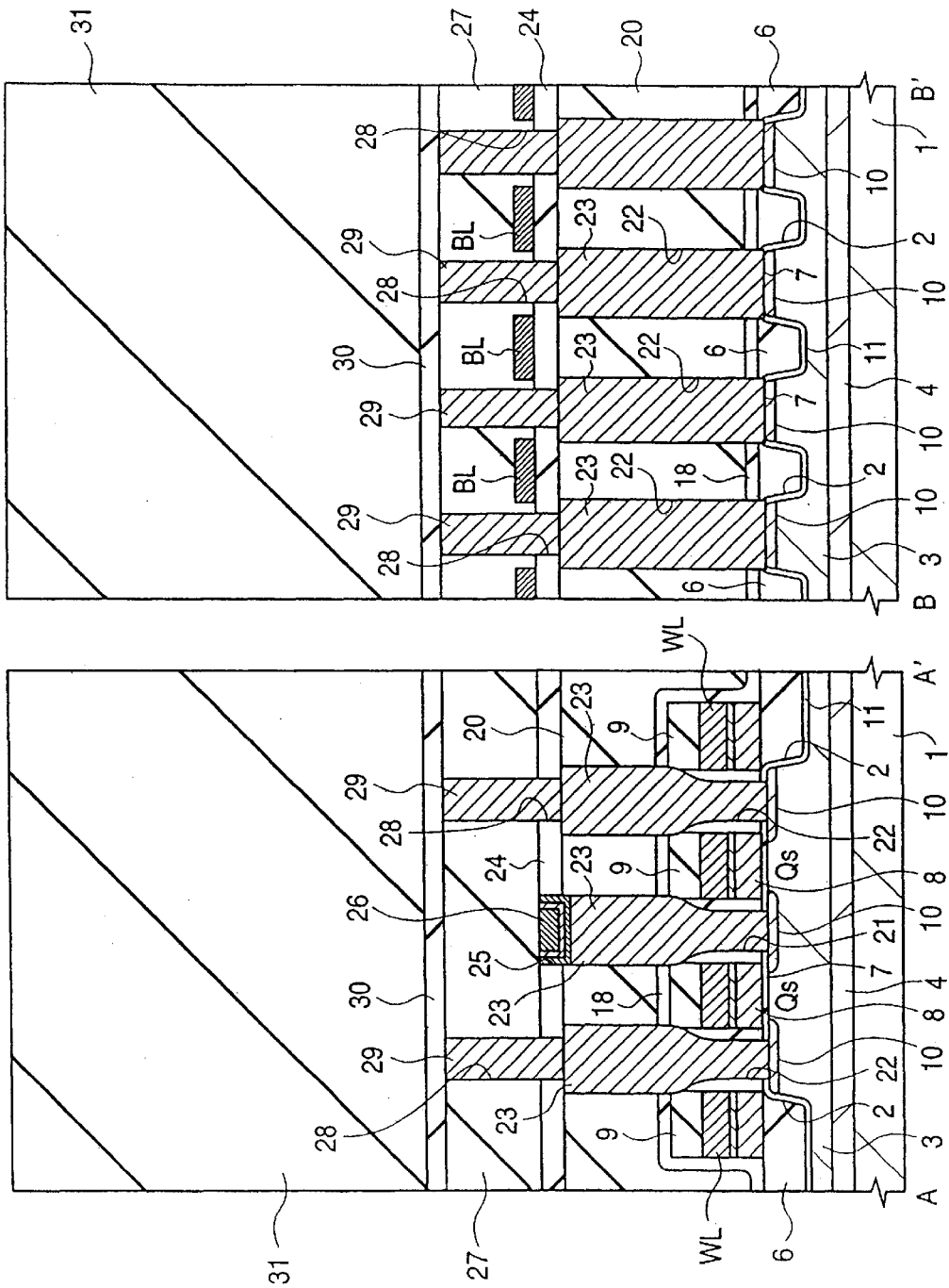

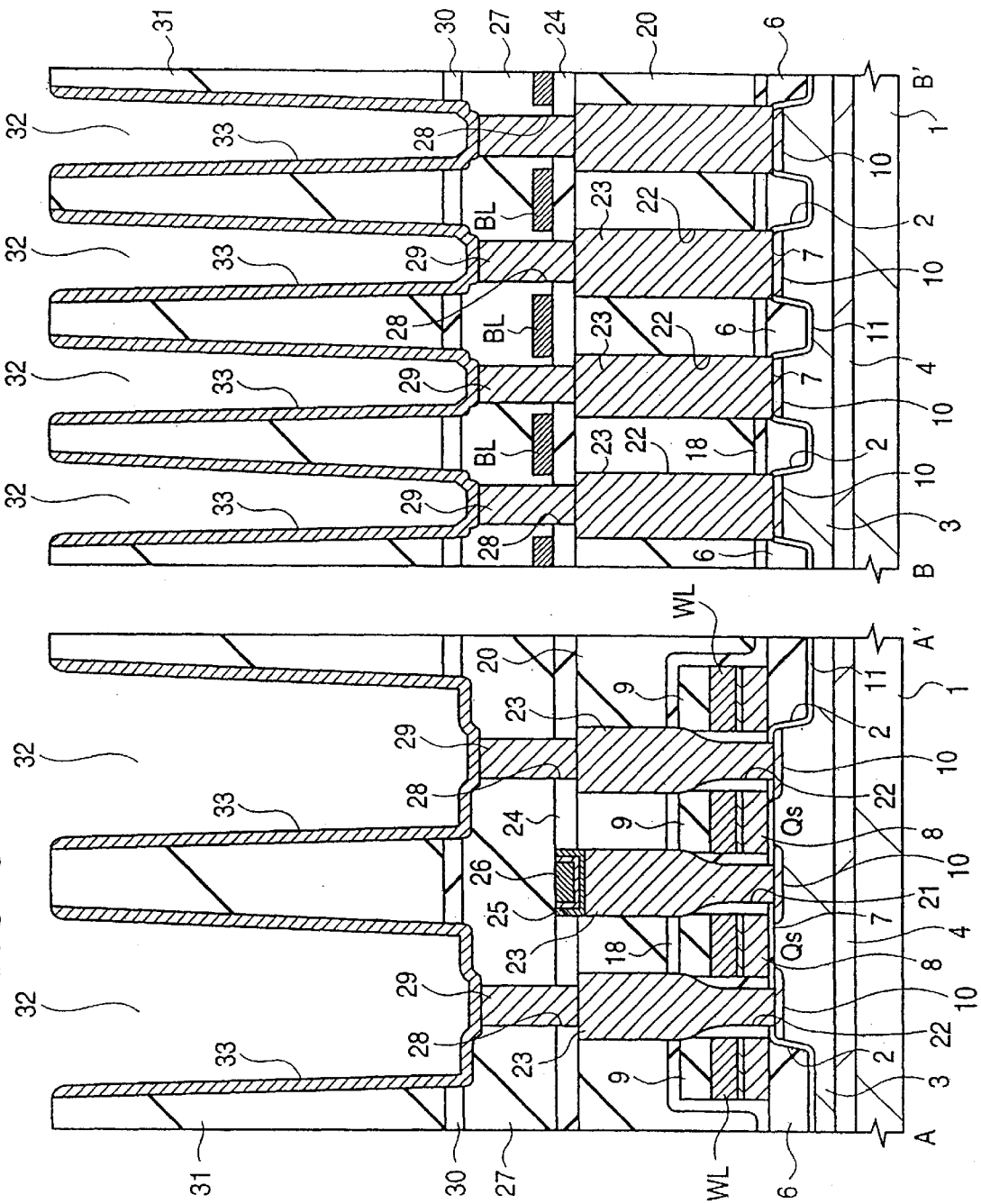

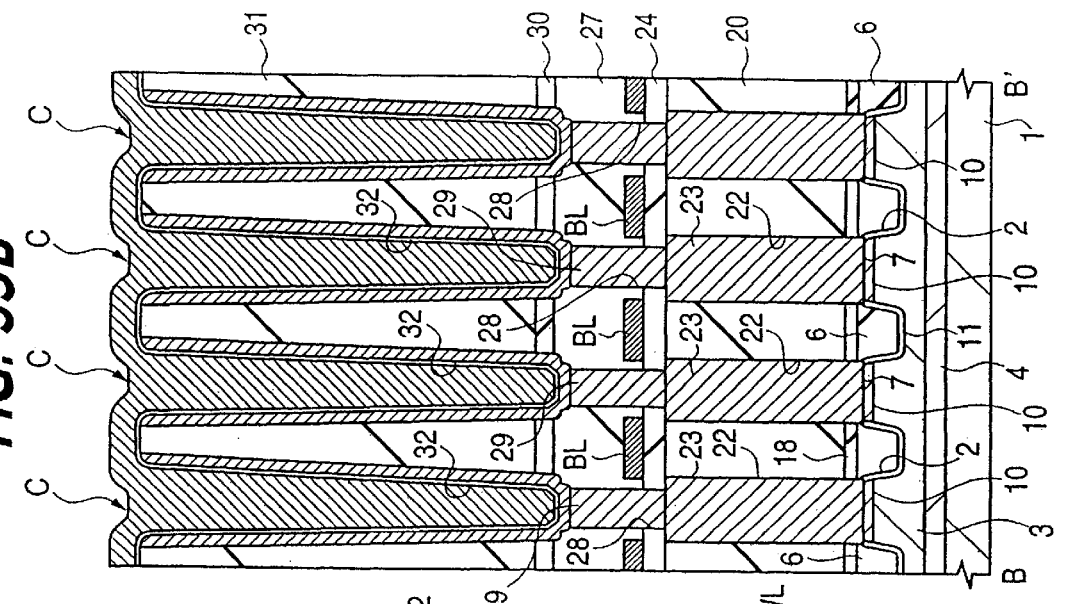
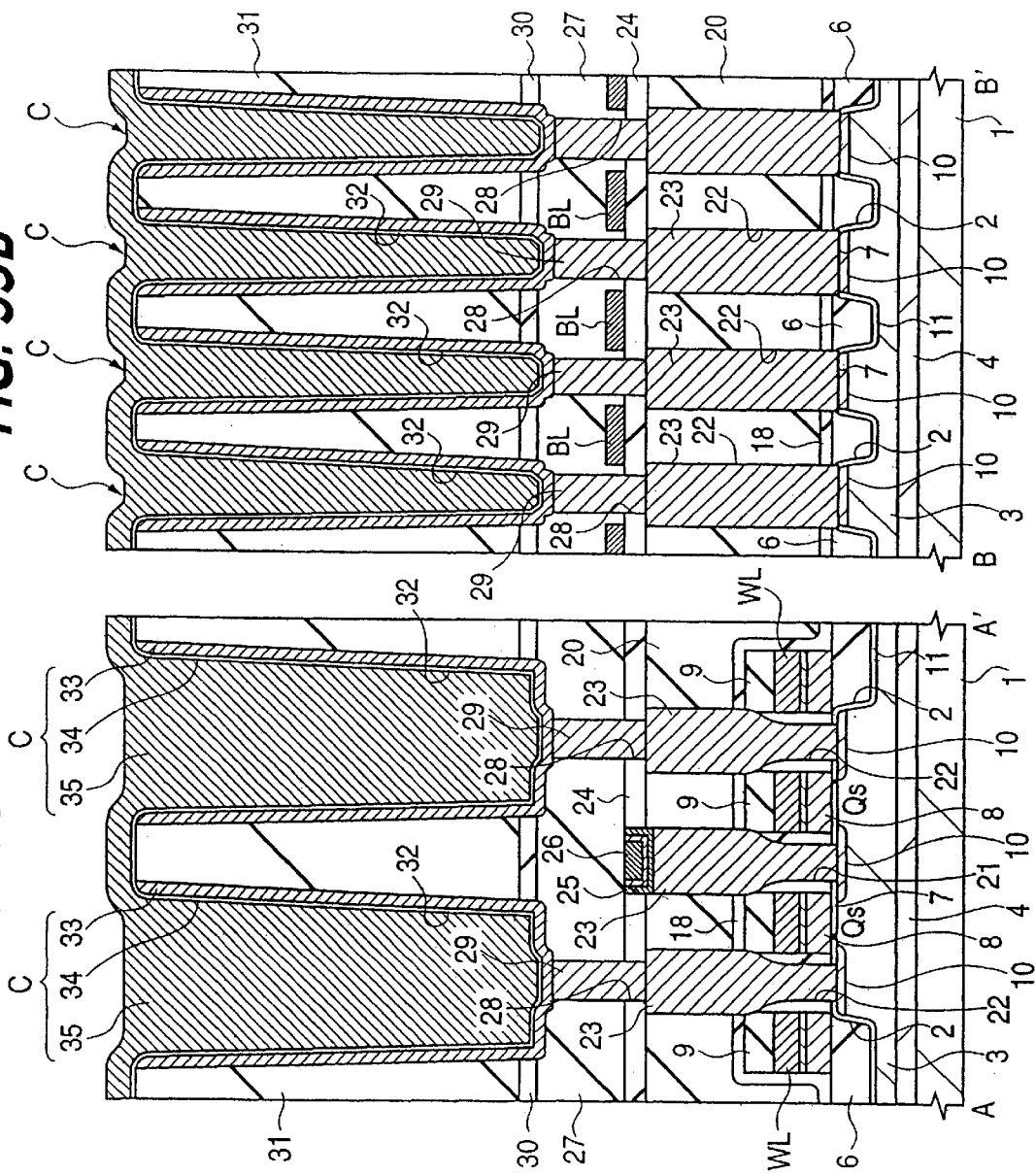

SEMICONDUCTOR INTEGRATED CIRCUIT DEVICE AND METHOD OF MANUFACTURING INVOLVING THE SCALE-DOWN WIDTH OF SHALLOW GROOVE ISOLATION USING ROUND PROCESSING

This is a continuation of application Ser. No. 09/889,018, filed Jul. 10, 2001, now U.S. Pat. No. 6,562,695, issued May 13, 2003, which is the National Stage of International Application No. PCT/JP99/06936, filed Dec. 10, 1999, the entire disclosures of which are hereby incorporated by reference.

TECHNICAL FIELD

The present invention relates to a semiconductor integrated circuit device and to a technique for manufacturing the same; and, more particularly, the invention relates to a device isolation structure for forming fine or micro MIS-FETs (Metal Insulator Semiconductor Field Effect Transistors) and a technique effective for application to a forming process thereof.

TECHNICAL BACKGROUND

With scale-down and high integration of semiconductor chips or elements, the introduction of a shallow groove isolation (SGI), of a type in which an insulating film is embedded inside each groove defined in a silicon substrate, is proceeding to provide a device isolation structure that serves as an alternative to a local oxidization of silicon (LOCOS) method.

The above-described shallow groove isolation is considered to be advantageous from the point of view of ensuring sub-threshold characteristics and reduction in junction leakage and a backgate effect, as compared with the LOCOS method, because (a) the device isolation interval or space can be reduced, (b) it is easy to control the film thickness for device isolation and set a field reverse voltage, and (c) an inversion preventive layer can be separated from a diffused layer and a channel region by separately implanting an impurity in side walls of the inside of each groove and the bottom thereof.

A common method for forming the shallow groove isolation is as follows: First of all, a silicon substrate is subjected to thermal oxidation and a thin silicon oxide film is formed on the surface thereof. Thereafter, a silicon nitride film is deposited thereabove by a CVD (Chemical Vapor Deposition) method. Next, each silicon nitride film lying in a device isolation region is removed by dry etching using a photoresist film as a mask. Thereafter, trenches or grooves are defined in the substrate by dry etching with the silicon nitride films being left in each active region as masks.

Next, a thick silicon oxide film is deposited on the substrate, including the interiors of the grooves, by the CVD method. Thereafter, the substrate is subjected to a thermal process, and the silicon oxide films embedded inside the grooves are elaborately densified. Thereafter, the silicon oxide films above the silicon nitride films are removed by a polishing process, such as etchback or chemical mechanical polishing (CMP) or the like, and the unnecessary silicon nitride films are then removed, whereby shallow groove isolations are completed. Shallow groove isolations are discussed, for example, in Japanese Laid-Open Patent Application No. Hei 02-260660, No. Hei 04-303942, No. Hei 08-97277 etc.

SUMMARY OF THE INVENTION

The present inventors have found that thinning (local thinning) occurs in that a gate oxide film formed on the surface of the substrate corresponding to each active region would locally be thinned at a peripheral portion of the active region, and a phenomenon (called a MOS-IV kink characteristic) in which a drain current tends to flow in response to a low gate voltage, have developed in the above-described device isolation structure. As a measure for solving these problems, the present inventors have considered a technique for rounding the peripheral portion of the active region (effecting round processing on it).

As a result of examining this approach, the present inventors have found that the (round processing) technique for rounding the peripheral portion of each active region, after the grooves are defined in the substrate, has a problem in that, since it requires a high-temperature thermal oxidizing process, a thermal oxide film formed on an inner wall of each groove due to the thermal oxidizing process at the time of round processing tends to grow to the active region side, thereby reducing the size of the active region, and, hence, this provides a hindrance to high integration and scale down of each MISFET.

Namely, a problem arises in that, when the round processing (round) is insufficient, thinning (local thinning) occurs in which a gate oxide film is thinly formed at a peripheral portion of each pointed active region upon oxidation for forming the gate oxide film, and a variation in the threshold voltage of each MISFET is produced due to a MOS-IV kink characteristic. It is necessary to sufficiently effect round processing (round) as an effective measure. However, when sufficient round is applied to the peripheral portion of the active region, the active region (particularly, in the direction of a gate width of each MISFET) becomes narrow. Therefore, the size (particularly, the gate width of the MISFET) of the active region cannot be ensured, and the semiconductor elements cannot be scaled down. In addition, this provides a hindrance to the desire for the width of each shallow groove isolation to be miniaturized and the semiconductor elements to be scaled down, so as to be brought into high integration.

An object of the present invention is to provide a technique that is capable of providing an advancement in the scale-down of MISFETS.

Another object of the present invention is to provide a technique that is capable of promoting the scale-down of the width of each shallow groove isolation.

The above and other objects and novel features of the present invention will become apparent from the description provided in the present specification from and the accompanying drawings.

Summaries of typical aspects and features of the invention disclosed in the present application will be described briefly as follows:

(1) A semiconductor integrated circuit device according to the present invention comprises a plurality of active regions each having an island-shaped plane pattern whose periphery is surrounded by shallow groove isolations, which are disposed on a main surface of a substrate so as to have predetermined intervals in a first direction, and semiconductor elements formed in the plurality of active regions, and wherein the sum of the width of each active region extending in the first direction and the space defined between the adjacent active regions constitutes a minimum pitch in the first direction, and the width of each active region in the first direction is set larger than one-half the minimum pitch.

(2) In a semiconductor integrated circuit device according to the item 1, the half of the minimum pitch is a minimum processing size determined according to a resolution limit of photolithography.

(3) In a semiconductor integrated circuit device according to the item 1 or 2, the semiconductor elements are respectively coupled to interconnections disposed so as to have predetermined intervals, and the width of each interconnection and the space between the adjacent interconnections are respectively set to the minimum pitch.

(4) A semiconductor integrated circuit device according to the present invention comprises a plurality of active regions each having an island-shaped plane pattern whose periphery is surrounded by shallow groove isolations, which are disposed on a main surface of a substrate so as to have predetermined intervals in a first direction, and semiconductor elements formed in the plurality of active regions, and wherein the sum of the width of each active region extending in the first direction and the space defined between the adjacent active regions is set to twice a minimum processing size determined according to a resolution limit of photolithography, the width of each active region is greater than or equal to the minimum processing size and the space defined between the adjacent active regions is less than or equal to the minimum processing size.

(5) In a semiconductor integrated circuit device according to the item 2, 3 or 4, the semiconductor elements are respectively coupled to interconnections disposed so as to have predetermined intervals, and the width of each interconnection and the space between the adjacent interconnections are respectively set to the minimum processing size determined according to the resolution limit of photolithography.

(6) In a semiconductor integrated circuit device according to the item 3 or 5, each of the semiconductor elements constitutes a memory cell, and each of the interconnections constitutes a word line or a bit line connected to the memory cell.

(7) In a semiconductor integrated circuit device according to any of the items 1 to 6, a peripheral portion of each active region whose periphery is surrounded by the shallow groove isolations, is shaped in the form of a section with a convex round.

(8) In a semiconductor integrated circuit device according to any of the items 1 to 7, the thickness of a gate insulating film of each semiconductor element formed on the surface of the substrate in each active region is equal in central and peripheral portions of the active region.

(9) In a semiconductor integrated circuit device according to any of the items 1 to 8, the semiconductor elements formed in each active region are comprised of MISFETs respectively, the MISFETs are memory cell selection MISFETs each of which constitutes part of each memory cell in a DRAM, and a capacitative element which constitutes another part of the memory cell in the DRAM, is connected in series with the memory cell selection MISFET.

(10) A method of manufacturing a semiconductor integrated circuit device, according to the present invention, comprises the following steps of:
forming silicon nitride films on a main surface of a substrate so that the sum of the width of each silicon nitride film extending in a first direction and the space defined between the adjacent silicon nitride films extending in the first direction constitutes a minimum pitch in the first direction,
forming side wall spacers on side walls of each silicon nitride film and thereafter defining grooves in the substrate in self-alignment with the side wall spacers,
removing the side wall spacers and thereafter oxidizing the substrate to thereby effect round processing on the surface of the substrate, and forming an insulating film on the substrate including the interiors of the grooves and thereafter removing the insulating film lying outside the grooves, and embedding the insulating film in the grooves to thereby define shallow groove isolations for defining each active region.

(11) A method of manufacturing a semiconductor integrated circuit device, according to the present invention, comprises the following steps of:
selectively forming silicon nitride films on a main surface of a substrate,
forming side wall spacers on side walls of the silicon nitride films respectively and thereafter etching the substrate in self-alignment with the side wall spacers to thereby define grooves in the substrate in each device isolation region,
removing the side wall spacers and thereafter subjecting the substrate to thermal oxidation to thereby effect round processing on the surface of the substrate at a peripheral portion of each active region, and
forming an insulating film on the substrate including the interiors of the grooves, thereafter removing the insulating film lying over each silicon nitride film and embedding the insulating film in the grooves to thereby define shallow groove isolations.

(12) A method of manufacturing a semiconductor integrated circuit device, according to the present invention, comprises the following steps of:
selectively forming silicon nitride films on a main surface of a substrate,
forming side wall spacers on side walls of the silicon nitride films respectively and thereafter etching the substrate in self-alignment with the side wall spacers to thereby define grooves in the substrate in each device isolation region,
removing the side wall spacers and thereafter subjecting the substrate to thermal oxidation to thereby effect round processing on the surface of the substrate at a peripheral portion of each active region,
etching each silicon nitride film to thereby recess a peripheral portion of each silicon nitride film to the center side of the active region, and
forming an insulating film on the substrate including the interiors of the grooves, thereafter removing the insulating film lying over each silicon nitride film and embedding the insulating film in the grooves to thereby define shallow groove isolations for defining the active regions.

(13) in a method of manufacturing a semiconductor integrated circuit device, according to the item 12, the etching for recessing the peripheral portion of the silicon nitride film to the center side of the active region is isotropic etching.

(14) A method of manufacturing a semiconductor integrated circuit device, according to any of the items 10 to 13 further includes a step of subjecting the substrate to thermal oxidation after the insulating film is embedded in the grooves to thereby form a gate insulating film for each MISFET on the surface of the substrate in each active region and then form each gate electrode for the MISFET on the gate insulating film.

(15) A method of manufacturing a semiconductor integrated circuit device, according to the item 14 further includes a step of forming a silicon oxide film on the surface of the substrate in each active region prior to the gate insulating film forming step, a step of implanting impurity ions in the substrate through the silicon oxide film, a step of subjecting the substrate to a thermal process to diffuse the impurity ions, thereby forming wells in the substrate, and a step of etching the surface of the substrate to thereby remove the silicon oxide film.

(16) In a method of manufacturing a semiconductor integrated circuit device, according to the item 14, the gate electrodes for the MISFETs extend across the active regions and the shallow groove isolations.

(17) In a method of manufacturing a semiconductor integrated circuit device, according to the item 14, the MISFETs are respectively memory cell selection MISFETs each of which constitutes part of each memory cell in a DRAM.

(18) In a method of manufacturing a semiconductor integrated circuit device, according to any of the items 10 to 17, each silicon nitride film has a slender and island-shaped plane pattern, and the size of each silicon nitride film in the first direction and the space defined between the silicon nitride films adjacent to each other in the first direction are respectively equal to a minimum size determined according to a resolution limit of photolithography.

(19) In a method of manufacturing a semiconductor integrated circuit device, according to the item 18, the gate electrodes for the MISFETs linearly extend along a second direction intersecting the first direction of each active region at the same widths and same spaces, and the widths and spaces are respectively equal to a minimum size determined according to a resolution limit of photolithography.

(20) In a method of manufacturing a semiconductor integrated circuit device, according to any of the items 10 to 19, the side wall spacers comprise a silicon oxide film.

(21) In a method of manufacturing a semiconductor integrated circuit device, according to any of the items 10 to 20, the thickness of each side wall spacer ranges from 5 nm to 40 nm.

(22) A method of manufacturing a semiconductor integrated circuit device, according to any of the items 10 to 21 further includes a step of forming the side wall spacers on the side walls of the silicon nitride films and thereafter implanting impurity ions in the neighborhood of the surface of the substrate including regions below the side wall spacers prior to the step of defining the grooves in the substrate.

(23) In a method of manufacturing a semiconductor integrated circuit device, according to any of the items 10 to 22, when the substrate is etched in self-alignment with the side wall spacers to define the grooves, the neighborhood of the surface of the substrate is first isotropically etched to thereby isotropically etch the neighborhood of the surface of the substrate in the regions below the side wall spacers, and the substrate is then anisotropically etched to define the grooves.

(24) In a method of manufacturing a semiconductor integrated circuit device, according to any of the items 10 to 23, the neighborhood of the surface of the substrate in the regions below the side wall spacers is isotropically etched after the removal of the side wall spacers, and the substrate is then subjected to thermal oxidation to thereby effect round processing on the surface of the substrate at the peripheral portion of each active region.

(25) In a method of manufacturing a semiconductor integrated circuit device, according to any of the items 10 to 24, the thermal oxidation for effecting the round processing on the surface of the substrate is performed plural times in parts.

(26) In a method of manufacturing a semiconductor integrated circuit device, according to any of the items 10 to 25, the inner walls of the grooves are etched prior to the step of embedding the insulating film in the grooves after the round processing of the surface of the substrate, whereby silicon oxide films formed on inner walls of the grooves by the thermal oxidation at the round processing are removed or thinned.

(27) In a method of manufacturing a semiconductor integrated circuit device, according to any of the items 10 to 26, the substrate is subjected to a thermal process after the insulating film is embedded in the grooves or in the course thereof to thereby densify the insulating film.

(28) A method of manufacturing a semiconductor integrated circuit device, according to the present invention, comprises the following steps of:
  (a) selectively forming silicon nitride films on main surfaces of first and second regions of a substrate,
  (b) forming first side wall spacers on side walls of the silicon nitride films left on the substrate,
  (c) covering the first region of the substrate with a first photoresist film and etching the first side wall spacers in the second region, thereby forming thin second side wall spacers thicker than the first side wall spacers on the side walls of the silicon nitride films in the second region,
  (d) removing the first photoresist film and thereafter etching the substrate in self-alignment with the first side wall spacers and second side wall spacers, thereby defining grooves in the substrate,
  (e) removing the first side wall spacers and second side wall spacers and thereafter subjecting the substrate to thermal oxidation, thereby effecting round processing on the surface of the substrate at a peripheral portion of each active region, and
  (f) forming an insulating film on the substrate including the interiors of the grooves, thereafter removing the insulating film above each silicon nitride film and embedding the insulating film in the grooves, thereby forming shallow groove isolations for defining each active region.

(29) A method of manufacturing a semiconductor integrated circuit device, according to the item 28, further includes, after the step (f), steps of:
  (g) removing the silicon nitride films and performing an etching process for reducing a step between the surface of the substrate corresponding to the active region and the surface of the insulating film lying within each shallow groove isolation,
  (h) subjecting the substrate to thermal oxidation to thereby form a first gate oxide film for a first MISFET on the surface of the substrate in the active region, (i) covering the second region of the substrate with a second photoresist film and etching the surface of the first region of the substrate, thereby removing the first gate oxide film in the first region, and (j) removing the second photoresist film and thereafter subjecting the substrate to thermal oxidation, thereby forming a second gate oxide film for a second MISFET on the surface of the first region of the substrate.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings, in which:

FIGS. 3A and 3B are fragmentary cross-sectional views of the substrate taken along lines A–A' and B–B', respectively, in FIG. 1;

FIGS. 4A and 4B are fragmentary cross-sectional views of a substrate, which show a step in the method of manufacturing a semiconductor integrated circuit device according to an embodiment 1 of the present invention;

FIGS. 5A and 5B are fragmentary cross-sectional views of the substrate, which illustrates a step in the method of manufacturing the semiconductor integrated circuit device according to embodiment 1 of the present invention;

FIG. 6 is a fragmentary plan view of the substrate, which depicts the method of manufacturing the semiconductor integrated circuit device according to embodiment 1 of the present invention;

FIGS. 7A and 7B are fragmentary cross-sectional views of the substrate, which show a step in the method of manufacturing the semiconductor integrated circuit device according to embodiment 1 of the present invention;

FIG. 8 is a fragmentary plan view of the substrate, which illustrates the method of manufacturing the semiconductor integrated circuit device according to embodiment 1 of the present invention;

FIGS. 9A and 9B are fragmentary cross-sectional views of the substrate, which show a step in the method of manufacturing the semiconductor integrated circuit device according to embodiment 1 of the present invention;

FIGS. 11A and 11B are fragmentary cross-sectional views of the substrate, which depicts a step in the method of manufacturing the semiconductor integrated circuit device according to embodiment 1 of the present invention;

FIGS. 12A and 12B are fragmentary cross-sectional views of the substrate, which illustrate a step in the method of manufacturing the semiconductor integrated circuit device according to embodiment 1 of the present invention;

FIGS. 13A and 13B are fragmentary cross-sectional views of the substrate, which show a step in the method of manufacturing the semiconductor integrated circuit device according to embodiment 1 of the present invention;

FIGS. 14A and 14B are fragmentary cross-sectional views of the substrate, which depict a step in the method of manufacturing the semiconductor integrated circuit device according to embodiment 1 of the present invention;

FIGS. 15A and 15B are fragmentary cross-sectional views of the substrate, which illustrate a step in the method of manufacturing the semiconductor integrated circuit device according to embodiment 1 of the present invention;

FIGS. 16A and 16B are fragmentary cross-sectional views of the substrate, which show a step in the method of manufacturing the semiconductor integrated circuit device according to embodiment 1 of the present invention;

FIGS. 17A and 17B are fragmentary cross-sectional views of the substrate, which illustrate a step in the method of manufacturing the semiconductor integrated circuit device according to embodiment 1 of the present invention;

FIGS. 18A and 18B are fragmentary cross-sectional views of the substrate, which show a step in the method of manufacturing the semiconductor integrated circuit device according to embodiment 1 of the present invention;

FIGS. 19A and 19B are fragmentary cross-sectional views of the substrate, which illustrate a step in the method of manufacturing the semiconductor integrated circuit device according to embodiment 1 of the present invention;

FIGS. 20A and 20B are fragmentary cross-sectional views of the substrate, which show a step in the method of manufacturing the semiconductor integrated circuit device according to embodiment 1 of the present invention;

FIGS. 22A and 22B are fragmentary cross-sectional views of the substrate, which illustrate a step in the method of manufacturing the semiconductor integrated circuit device according to embodiment 1 of the present invention;

FIGS. 24A and 24B are fragmentary cross-sectional views of the substrate, which show a step in the method of manufacturing the semiconductor integrated circuit device according to embodiment 1 of the present invention;

FIGS. 32A and 32B are fragmentary cross-sectional views of the substrate, which show a step in the method of manufacturing the semiconductor integrated circuit device according to embodiment 1 of the present invention;

FIGS. 34A and 34B are fragmentary cross-sectional views of the substrate, which show a step in the method of manufacturing the semiconductor integrated circuit device according to embodiment 1 of the present invention;

FIGS. 35A and 35B are fragmentary cross-sectional views of the substrate, which illustrate a step in the method of manufacturing the semiconductor integrated circuit device according to embodiment 1 of the present invention;

DESCRIPTION OF THE PREFERRED EMBODIMENTS

Figure 1:
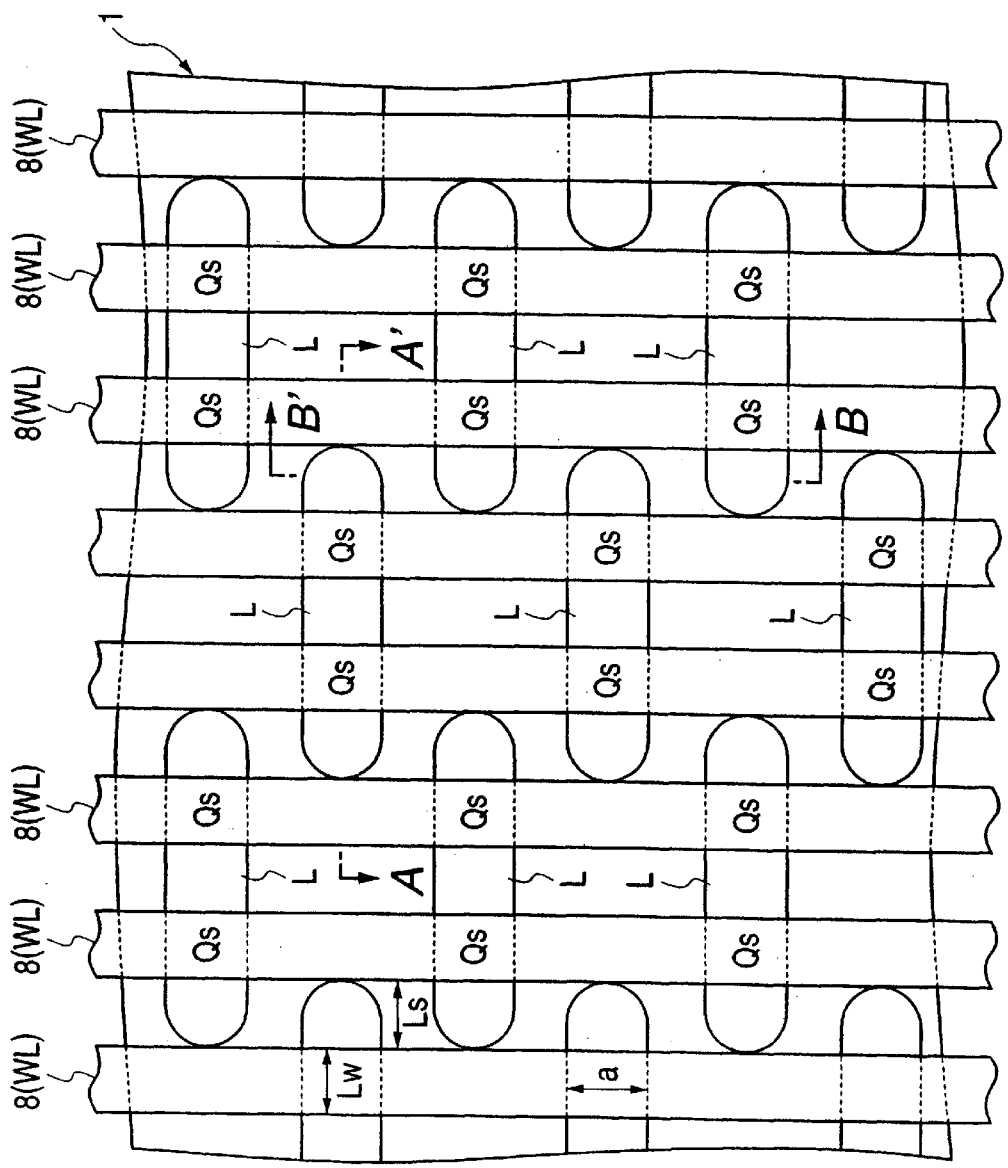
FIG. 1 is a fragmentary plan view of a substrate as it appears in the course of a process of manufacturing a semiconductor integrated circuit device representing one embodiment of the present invention.

Preferred embodiments of the present invention will be described in detail with reference to the accompanying drawings. Incidentally, elements or components having the same function in all the drawings illustrating the various embodiments are identified by the same reference numerals, and a repetitive description thereof will therefore be omitted.

[Embodiment 1]

Figure 2:
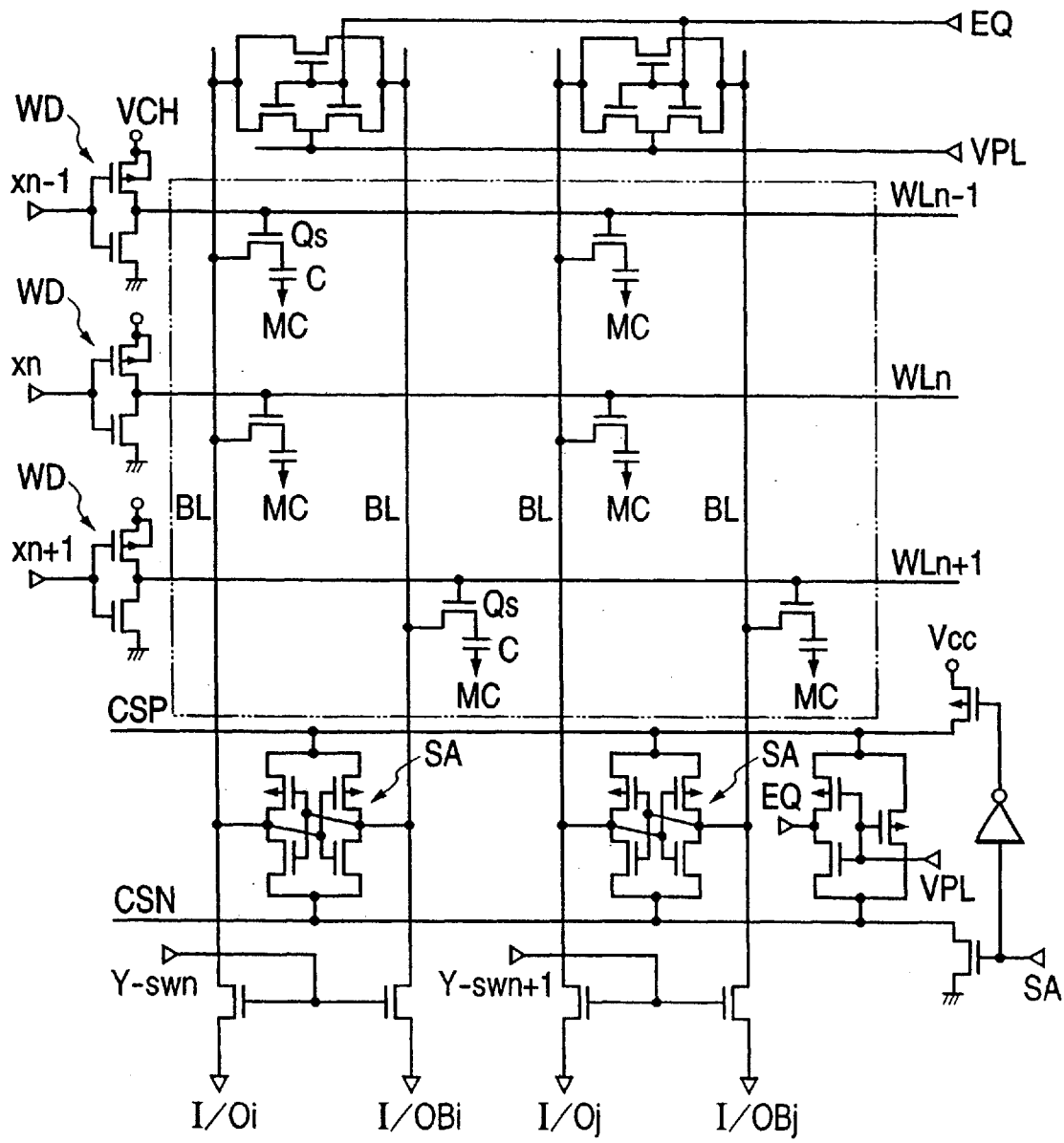
FIG. 2 is an equivalent circuit diagram of a memory array in a DRAM.

FIG. 1 is a fragmentary plan view of a substrate as seen in the course of a manufacturing process, FIG. 2 is an equivalent circuit diagram of a memory array in a DRAM, and FIGS. 3A and 3B are a cross-sectional views of the substrate, taken along line A–A' of FIG. 1 and taken along line B–B' of FIG. 1, respectively.

Active regions L, whose peripheries are respectively defined by device isolation trenches or grooves or shallow groove isolations 2, are formed on a p type well 3 formed on a main surface of a substrate 1 comprised of, for example, p type mono-crystalline silicon. As shown in FIG. 1, the active regions L are respectively formed in slender, island-shaped plane patterns which extend in the direction taken along line A–A'. As also shown in FIGS. 3A and 3B, the surface of the substrate 1 (p type well 3) in or corresponding to each active region L takes a sectional form whose central portion is flat and whose peripheries (ends) are respectively shaped to have of a convex round shape.

Two MISFETs (memory cell selection MISFETs Qs), which share one of the source and drain (n type semiconductor regions 10), are respectively formed within the active regions L. Each memory cell selection MISFET Qs and an information storage capacitative element C to be described later are electrically series connected to each other, and this combination constitutes a one-bit memory cell MC of a DRAM (Dynamic Random Access Memory). As shown in FIG. 2, each memory cell MC is electrically coupled to a point where a word line WL and a bit line BL intersect.

Each of the memory cell selection MISFETs Qs is comprised principally of a gate oxide film 7 formed on the surface of the substrate 1 (p type well 3) corresponding to the active region L, a gate electrode 8 formed on the gate oxide film 7, and a pair of n type semiconductor regions 10, 10 (source and drain) formed in the substrate 1 (p type well 3) in the active region L. As will be described later, either one of the n type semiconductor regions 10 (source and drain) is electrically connected to its corresponding bit line BL, whereas the other thereof is electrically connected to one electrode (lower electrode 33) of each information storage capacitative element C.

The gate electrode 8 of each memory cell selection MISFET Qs is formed integrally with its corresponding word line WL. Namely, the gate electrode 8 is electrically connected to its corresponding word line WL. The gate electrodes 8 (word lines WL) linearly extend at the same widths and intervals or spaces along the line B–B' of FIG. 1, i.e., the transverse direction of the active region L. The width (gate length) (Lw) thereof and the interval or space (Ls) thereof are respectively equal to the minimum size (e.g., 0.16 μm=Lw=Ls) determined according to a resolution limit of photolithography.

Thus, each wiring pitch corresponding to the sum of the width (Lw) of each word line WL (gate electrode 8) and the interval or space (Ls) between the adjacent word lines WL (gate electrodes 8) is set to twice the minimum processing size. Thus, since the wiring pitch (Lw+Ls) in the direction in which each word line WL (gate electrode 8) extends, can be reduced, each memory cell can be miniaturized or scaled down and brought into high integration.

The gate electrode 8 (word line WL) is formed by a polymetal structure in which a barrier metal film, such as WN (tungsten nitride), and a W (tungsten) film are stacked over a low-resistance poly-crystalline silicon film doped with an n type impurity such as P (phosphorus). A silicon nitride film 9 having the same plane pattern as the gate electrode 8 (word line WL) is formed over each gate electrode 8 (word line WL).

As will be also described later, the bit lines BL are formed at the same line widths and same intervals or spaces along the direction in which they intersect the word lines WL (gate electrodes 8). The line width (Lw') and space (Ls') are respectively defined to the minimum size (e.g., 0.16 μm) determined according to the resolution limit of photolithography (see FIG. 29).

As described above, each wiring pitch corresponding to the sum of the width (Lw') of each bit line BL and the spaced width (Ls') between the adjacent bit lines BL is set to twice the minimum processing size. Thus, since the wiring pitch (Lw'+Ls') in the direction in which each bit line BL extends can be reduced, each memory cell can be miniaturized or scaled down and brought into high integration.

Each of the shallow groove isolations (device isolation regions) 2, which surround the substrate 1 (p type well 3) having the active regions L, is defined such that a silicon oxide film 6 is embedded inside trenches or grooves each having a depth of about 350 nm, which are defined in the substrate 1 (p type well 3) The surface of the silicon oxide film 6 is flattened and the height thereof is substantially equal to the surface of the substrate 1 (p type well 3) corresponding to each active region L. A thin silicon oxide film 11 for relaxing stress developed between the silicon oxide film 6 and the substrate 1 (p type well 3) is formed at an interface between an inner wall of each shallow groove isolation 2 and the silicon oxide film 6. Incidentally, the size (a) of the short side of each active region L forms a gate width (a) of each memory cell selection MISFET Qs.

A method of manufacturing the above-described DRAM will be described in process order with reference to FIGS. 4A through 35B. Of these drawings, FIGS. 4A, 5A, 7A, 9A, 11A through 20A, 22A, 24A, 26A, 28A and 30A through 35A are respective cross-sectional views of a substrate 1, which are taken along the longitudinal direction (the direction as seen along line A–A' of FIG. 1) of each active region L; whereas, FIGS. 4B, 5B, 7B, 9B, 11B through 20B, 22B, 24B, 26B, 28B and 30B through 35B are respective cross-sectional views of the substrate 1, which are taken along the transverse direction (the direction as seen along line B–B' of FIG. 1) of each active region L. Only plane patterns for the active regions, gate electrodes (word lines), bit lines and connecting holes (contact holes and through holes) are respectively shown in the plan views (FIGS. 6, 8, 25, 27 and 29), and the illustration of insulating films (silicon oxide film, silicon nitride film) and a conductive film constituting a plug are omitted.

First, the substrate 1 comprised of p type monocrystalline silicon having a resistivity of from about 1 Ωcm to about 100 Ωcm, for example, is subjected to thermal oxidation at about 850° C. A thin oxide silicon film (first silicon oxide film) 13 having a thickness of about 10 nm is formed on the surface of the substrate 1. Thereafter, a silicon nitride film 14 having a thickness of about 120 nm is deposited over the silicon oxide film 13 by a CVD method. The silicon oxide film 13 between the silicon nitride film 14 and the substrate 1 is formed to relax stress developed at an interface between the substrate 1 and the silicon nitride film 14 and to prevent defects, such as dislocation, from occurring in the surface of the substrate 1 due to stress.

Next, the silicon nitride film 14 in each device isolation region and the silicon oxide film 13 located therebelow are selectively removed by dry etching using a photoresist film (not shown) as a mask, as shown in FIGS. 5A and 5B. When the silicon oxide film is left even slightly on the surface of the substrate 1 corresponding to each device isolation region at this time, this leads to the presence of foreign substances on the substrate. Therefore, the substrate 1 is overetched to completely remove the silicon oxide film on the surface thereof. The amount of overetching to which the substrate 1 is subjected may be about 10 nm to 30 nm. Further, the end of the overetched portion of the substrate 1 may preferably be tapered without being set vertically because it is easy to round during the subsequent round processing.

As shown in FIGS. 5A, 5B and 6, each silicon nitride film 14 left on the substrate 1 is formed in a slender, island-shaped plane pattern which defines each active region L. The size (W) of a short side thereof extending along line B–B' and the space (S) between the adjacent silicon nitride films 14 are respectively equal to the minimum size (e.g., 0.16 μm=W=S) determined according to the resolution limit of photolithography. The size of a long side thereof extending along line A–A' of each silicon nitride film 14 is equal to five times (e.g., 0.8 μm) the size (W) of the short side.

Thus, in the present embodiment, since the width Lw' of each bit line BL formed in the subsequent process and the space Ls' between the adjacent bit lines BL are respectively set to the minimum size determined according to the resolution limit of photolithography, the size (W) of the short side of each silicon nitride film 14 defining the active region L and the space (S) between the adjacent silicon nitride films 14 are respectively set to such a minimum size.

Next, as shown in FIGS. 7A, 7B and 8, the silicon oxide film deposited over the substrate 1 by the CVD method is anisotropically etched to thereby form side wall spacers 16 on the corresponding side walls of each silicon nitride film 14.

The film thickness (spacer length) Lsi of each side wall spacer 16 referred to above is set to a range from 5 nm to 40 nm, preferably, 10 nm to 20 nm, more preferably, about 15 nm. When a thermal oxidation process for performing round processing on a peripheral portion of the active region L in the subsequent process is performed, where the spacer length is less than 5 nm, the size of the short side of the post-process active region L would become smaller than the minimum size (e.g., 0.16 μm) determined according to the resolution limit of photolithography. On the other hand, when the spacer length Lsi exceeds 40 nm, the amount of rounding of the peripheral portion of each active region L becomes insufficient. Further, since the aspect ratio (corresponding to the depth/width of each groove or trench)

of each trench or groove 2a defined in the substrate 1 having the device isolation regions in the subsequent process becomes large, the coverage of a silicon oxide film 6 to be embedded in the groove 2a and the flatness of the surface thereof result in an insufficiency.

Next, impurity ions are implanted in the substrate 1, as shown in FIGS. 9A and 9B to thereby to subject the surface of the substrate 1 to damage in a region serving as the peripheral portion of each active region L in the subsequent process. Since the region which serves as the peripheral portion of each active region L is located below each side wall spacer 16 at this time, the impurity ions are implanted diagonally with respect to a main surface of the substrate 1 so as to damage the substrate 1 in this region. While the implantation of the impurity ions is not an essential process, the peripheral portion of each active region L is easy to round when the substrate 1 is subjected to thermal oxidation if the surface of the substrate 1 is damaged in advance and covalent bonds of silicon are locally cut off. When an element having a large atomic weight, like Ge (Germanium) or As (arsenic), is used as the impurity, it is possible to limit damage only to the surface of the substrate 1 corresponding to the peripheral portion of each active region L.

Figure 10:
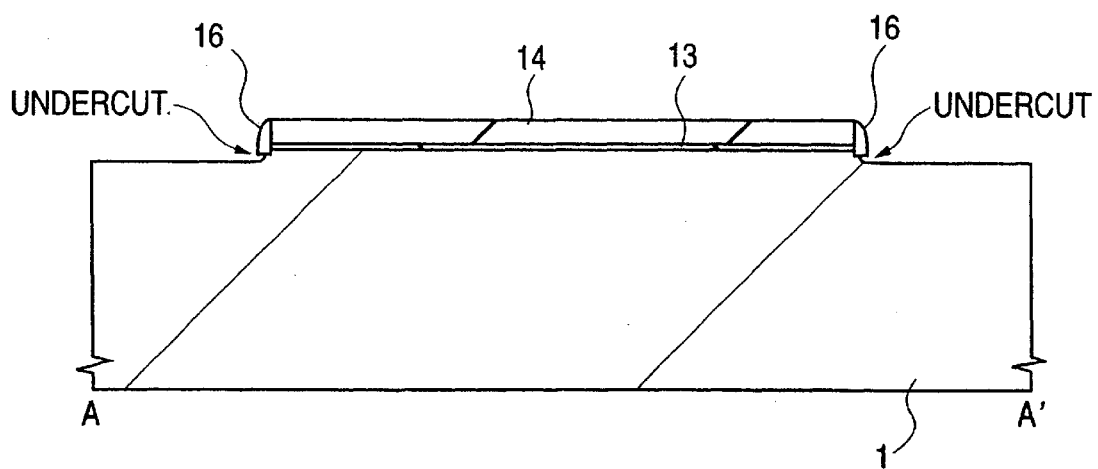
FIG. 10 is a fragmentary cross-sectional view of the substrate, which illustrates a step in the method of manufacturing the semiconductor integrated circuit device according to embodiment 1 of the present invention.

Next, foreign substances left on the surface of the substrate 1 are removed by cleaning using, for example, an SC-1 solution (mixed solution of ammonia solution/hydrogen peroxide solution) and an SC-2 solution (mixed solution of hydrochloric acid/hydrogen peroxide solution). Further, a native oxide film on the surface of the substrate 1 is removed by cleaning using hydrofluoric acid. While it is not an essential process, the peripheral portion of each active region L is easy to round in the subsequent process where the above cleaning is performed for a time interval longer than usual to isotropically etch the surface of the substrate 1, thereby producing undercuts in the substrate 1 below each side wall spacer 16, as seen in FIG. 10.

Next, as shown in FIGS. 11A and 11B, grooves 2a, each having a depth of about 350 nm, are defined in the substrate 1 corresponding to each device isolation region by dry etching using the silicon nitride films 14 and side wall spacers 16 as masks. When the composition of a gas (e.g., $CF_4+O_2$) for etching the substrate 1 is adjusted upon defining each groove 2a and a taper of 80° or thereabout is created in the side wall of the groove 2a, the silicon oxide film 6 deposited in the subsequent process becomes easily embedded inside the groove 2a. It is, however, needless to say that the angle of the taper is limited by the depth and width of each groove.

Next, as shown in FIGS. 12A and 12B, the side wall spacers 16 on the side walls of the silicon nitride films 14 are removed by wet etching using hydrofluoric acid. Incidentally, this is not an essential process. However, when wet etching using the SC-1 solution or the like is performed after the above wet etching, and the surface of the substrate 1 below each side wall spacer 16 is lightly rounded, the peripheral portion of each active region L becomes easy to round in the next thermal oxidation process.

Thus, in the present embodiment, the grooves 2a are defined in the substrate 1 corresponding to the device isolation regions by dry etching using the silicon nitride films 14 and the side wall spacers 16 formed on their side walls as the masks. Thus, an actual size W' of each active region L becomes larger than a size W of the silicon nitride film 14 defining each active region L by a size equivalent to twice the thickness (spacer length) Lsi of each side wall spacer 16 (W'=W+2Lsi>W). On the other hand, the space (S'=S−2Lsi<S) between the adjacent active regions L extending along the transverse direction thereof becomes narrow correspondingly. Thus, when the size (W) of the short side of each silicon nitride film 14 defining the active region L and the space between the adjacent silicon nitride films 14 are respectively set to the minimum size determined according to the resolution limit of photolithography (W=S minimum size), the actually obtainable size W' (>W) of the short side of each active region L becomes larger than the minimum size determined according to the resolution limit of photolithography, and the space (size of each groove 2a) S' (<S) between the adjacent active regions L extending along the transverse direction thereof becomes smaller than the minimum size.

Next, as shown in FIGS. 13A and 13B, the substrate 1 is subjected to thermal oxidation at a temperature of from about 850□C. to about 1000□C., to thereby form a thin silicon oxide film 11, having a thickness of about 10 nm, on inner walls of the grooves 2a. The silicon oxide film 11 is formed to recover damage of dry etching, which has been developed in the inner wall of each groove 2a and relax stress developed at an interface between the silicon oxide film 6 embedded inside each groove 2a in the subsequent process and the substrate 1 (p type well 3). Owing to the execution of this thermal oxidation process, the surface of the substrate 1 corresponding to the peripheral portion of each active region L is subjected to round processing, thus resulting in a sectional shape in the form of a convex round shape.

As described above, the size of each active region L at the time that the grooves 2a are defined in the substrate 1 having the device isolation regions is larger than the size of each silicon nitride film 14 defining the active region L (by the size equivalent to twice the thickness of each side wall spacer 16). Therefore, even if a thin silicon oxide film 11 having a thickness of about 10 nm is formed on the inner wall of each groove 2a, the size (a) of each active region L is not reduced as compared with the size (W) of the silicon nitride film 14. According to the present embodiment as described above, the surface of the substrate 1 at the end of each active region L can be subjected to round processing without reducing the size of the active region L.

Incidentally, the above-described thermal oxidation process for rounding the peripheral portion of each active region L may be performed twice in parts. Since the end becomes round to some extent in the first thermal oxidation process in this case, the end can be easily rounded by the thermal oxidation process performed the second time.

When the thickness of the silicon oxide film 11 becomes excessively thick, stress is developed in the peripheral portion of each active region L and the inner wall of each groove 2a, as well as a reduction in the size of each active region L, so that defects are apt to occur. Thus, when the thermal oxidation process is performed twice in parts, for example, the end may be sufficiently rounded in the first thermal oxidation process, and the second thermal oxidation process may be set as a light thermal process corresponding to such an extent that the forms of the peripheral portion of each active region L and the inner wall of each groove 2a are improved. In order to relax the above-described stress, the substrate 1 may be subjected to thermal processing in a high-temperature hydrogen atmosphere prior to a process for executing the thermal oxidation process after the removal of the side wall spacers 16. Further, the silicon oxide film 11 may be removed by wet etching using hydrofluoric acid or the like after the execution of round processing, or the thickness of the silicon oxide film 11 may be thinned.

Next, a silicon oxide film 6 is deposited over the substrate 1 including the inside of each groove 2a by the CVD method, as shown in FIGS. 14A and 14B. The silicon oxide film 6 is deposited thereon with a thickness (for example, a thickness of from about 450 nm to about 500 nm) greater than the depth of each groove 2a and is formed so as to be embedded inside each groove 2a without any space. The silicon oxide film 6 is deposited by a film growing or depositing method having good step coverage, as in the case of a silicon oxide film grown by a CVD method using oxygen and tetraethoxysilane ($Si(C_2H_5O)_4$), for example. Incidentally, a silicon nitride film (not shown) may be deposited thinly over the inner wall of each groove 2a by the CVD method prior to the process for depositing the silicon oxide film 6. This silicon nitride film has the function of restraining the thin silicon oxide film 11 on the inner wall of each groove 2a from growing thick on the active region L side upon densifying the silicon oxide film 6 embedded in each groove 2a.

Next, the densifying process for improving the quality of the silicon oxide film 6 is executed by subjecting the substrate 1 to thermal oxidation at a temperature of from about 1000° C. to about 1150° C. Thereafter, the silicon oxide film 6 provided over each groove 2a is polished by a chemical mechanical polishing (CMP) method to thereby flatten the surface thereof, as shown in FIGS. 15A and 15B. This polishing is performed with the silicon nitride film 14 covering the substrate 1 corresponding to each active region L as a stopper. The time, when slight over-polishing is performed to such an extent that the surface of each silicon nitride film 14 is exposed and the silicon oxide film 6 lying over each silicon nitride film 14 is not left behind, will be defined as an end point.

When the silicon oxide film 6 has been flattened, the portion lying over each silicon nitride film 14 is first removed by dry etching using each photoresist film as a mask. Next, the photoresist film is removed, and, thereafter, the silicon oxide film 6 left over each groove 2a may be polished by the CMP method. Further, densifying of the silicon oxide film 6 may be performed after the flattening of the silicon oxide film 6. Since, in this case, the densifying thereof is carried out in a state in which the thickness of the silicon oxide film 6 is thin, the thermal processing condition can be reduced as compared with the case where a thick silicon oxide film 6 antecedent to its polishing is densified. Each shallow groove isolation 2 with the silicon oxide film 6 embedded in each groove 2a is substantially completed by the processes carried out up to now.

Next, each silicon nitride film 14 covering the substrate 1 corresponding to each active region L is removed by wet etching using thermal phosphoric acid, whereby each silicon oxide film 13 located therebelow is made bare or exposed, as seen in FIGS. 16A and 16B. When such etching is carried out, a step having a height equivalent to the thickness of the silicon nitride film 14 occurs between the surface of the silicon oxide film 13 and the surface of the silicon oxide film 6 embedded in each shallow groove isolation 2.

Next, when the silicon oxide film 13 lying over the surface of the substrate 1 corresponding to each active region L is wet-etched by hydrofluoric acid, as shown in FIGS. 17A and 17B, the surface of the substrate 1 corresponding to each active region L is exposed and at the same time the surface of the silicon oxide film 6 lying within each shallow groove isolation 2 is etched, so that the step is reduced.

When the above-described wet etching is done, the end of each silicon oxide film 6 lying within the shallow groove isolation 2, i.e., the sides as well as the upper surface of each silicon oxide film 6 lying in the region which has adjoined the silicon nitride film 14, are also subjected to an etchant. Therefore, the etched amount increases as compared with each portion distant from the active region L. However, since the size of each active region L is greater than that of the silicon nitride film 14 in the present embodiment, the end of each silicon oxide film 6, at the time when the silicon nitride film 14 has been removed, is located on the active region L side is farther than the end of each shallow groove isolation 2. Therefore, even if the etched amount of the end of each silicon oxide film 6 increases, the silicon oxide film 6 is not recessed greatly downwards at the end of each shallow groove isolation 2.

Next, the substrate 1 is subjected to thermal oxidation at about 850° C., as shown in FIGS. 18A and 18B, to thereby form a thin silicon oxide film 17 having a thickness of about 10 nm on the surface of the substrate 1 corresponding to each active region L. The silicon oxide film 17 is formed to lessen the influence of damage to the substrate 1 and its contamination due to ion implantation of an impurity, which is to be performed in the following process.

Next, a p type impurity (boron) and an n type impurity (e.g., phosphorus) are ion-implanted in the substrate 1 through the silicon oxide films 17 to form wells (p type well 3 and n type well 4), as shown in FIGS. 19A and 19B. In order to form a p type semiconductor region (not shown) in which a channel for each memory cell selection MISFET Qs is formed, the p type impurity (boron) is ion-implanted in the substrate 1 through each silicon oxide film 17 referred to above. Impurity ions for forming the wells (p type well 3 and n type well 4) are implanted in a deep region of the substrate 1 with high energy, whereas impurity ions for forming each channel are implanted in a shallow region of the substrate 1 with low energy.

Next, the substrate 1 is subjected to thermal processing at about 950° C., as shown in FIGS. 20A and 20B, to diffuse the impurities, thereby forming the p type well 3 and the n type well 4. The n type well 4 located below the p type well 3 is formed to prevent the entry of noise into the p type well 3 through the substrate 1 from an unillustrated input/output circuit or the like.

Next, the silicon oxide film 17 provided on the surface of the substrate 1 is removed by wet etching using hydrofluoric acid, and, thereafter, the substrate 1 is subjected to thermal oxidation at a temperature of from about 800° C. to about 850° C., whereby a clean gate oxide film 7 having a thickness of about 7 nm is formed on the surface thereof. Since the surface of the substrate 1 corresponding to the peripheral portion of each active region L is provided with the convex round shape as described above, the thickness of the gate oxide film 7 becomes substantially equal at the central and peripheral portions of each active region L.

The gate oxide film 7 may be comprised of a silicon oxynitride film which contains silicon nitride. Since the silicon oxynitride film has the high effect of restraining or controlling the occurrence of an interface state in the film and of reducing an electronic trap as compared with the silicon oxide film, hot carrier resistance of the gate oxide film 7 can be improved. In order to form the silicon oxynitride film, the substrate 1 may be subjected to thermal oxidation in an atmosphere containing a nitrogen gas like NO or $NO_2$, for example.

Owing to the provision of the peripheral portion of each active region L with the round shape in this way, a thinning defect in the thickness direction of each gate oxide film 7 at the peripheral portion of each active region L is prevented from occurring, and an electric field based on a gate voltage is restrained from concentrating on the peripheral portion of each active region L. It is thus possible to prevent the occurrence of a MOS-IV kink characteristic (or hump characteristic) in which a drain current flows due to a low gate voltage, and a reduction in withstand voltage of each gate oxide film 7, whereby each memory cell selection MISFET Qs is improved in characteristic. Further, since a leakage current is restrained from flowing at the peripheral portion of each active region L, the refresh characteristic of each memory cell is improved. Furthermore, a variation in threshold voltage of each MISFET due to the thinning and MOS-IV kink characteristic is prevented from occurring.

Figure 21A:
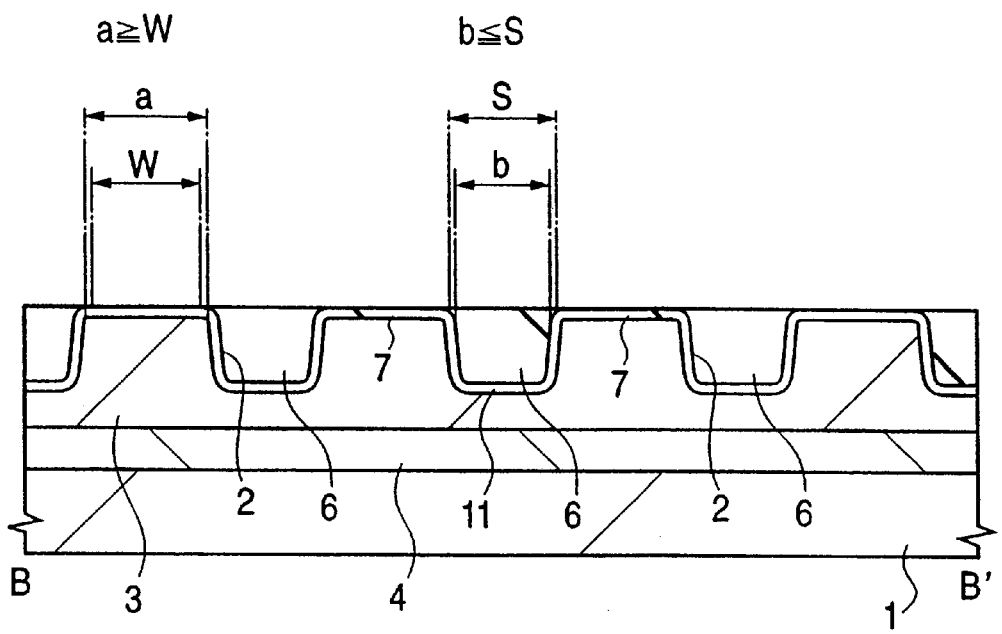
FIGS. 21(*a*) and 21(*b*) are, respectively, fragmentary cross-sectional views of the substrates, which show a step in the method of manufacturing the semiconductor integrated circuit device according to embodiment 1 of the present invention.

FIG. 21(a) is a cross-sectional view taken along the direction extending along line B–B' of the substrate 1 when the gate oxide films 7 have been formed. In the processes carried out up to now, as shown in the drawing, the size (a) of the short side of each active region L becomes greater than or equal to the size (W) of the short side of the silicon nitride film 14 (a≧W). Further, the interval or space (size of each shallow groove isolation 2) (b) between the adjacent active regions L along the short-side direction becomes less than or equal to the space (S) between the adjacent silicon nitride films 14 (b≦S) Namely, when the size (W) of the short size of each silicon nitride film 14 and the space (S) defined between the adjacent silicon nitride films 14 are respectively set to the minimum size (e.g., 0.16 μm) determined according to the resolution limit of photolithography, the size (a) of the short side of each active region L becomes greater than or equal to the minimum size.

Figure 21B:
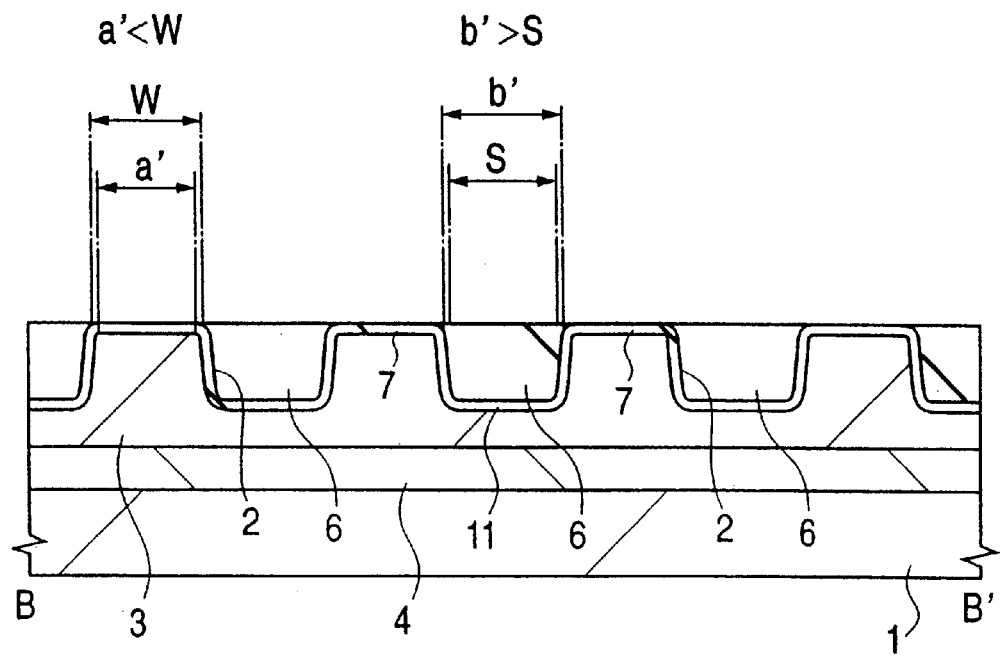

On the other hand, when each shallow groove isolation is defined by dry etching using only each silicon nitride film 14 as a mask without forming the side wall spacers 16 on the corresponding side walls of each pattern for the silicon nitride film 14 for defining each active region, and thereafter the peripheral portion of each active region is rounded by round processing corresponding to that shown in FIGS. 13A and 13B, the peripheral portion of each active region is sufficiently rounded according to this round process. Therefore, the size (a') of the short side of each active region L becomes smaller than the size (W) of the short side of each silicon nitride film 14, for defining the dimension of each active region L (a'<W), and the interval or space (corresponding to the size of the shallow groove isolation 2) (b') between the adjacent regions L extending along the direction of the short side becomes greater than the space (S) defined between the silicon nitride films 14 (b'>S), as seen in FIG. 21(b). Namely, since the active region L cannot ensure the minimum size determined according to the resolution limit of photolithography in this case, a memory cell cannot be formed.

Thus, even if the width (W') of the pattern for the silicon nitride film 14 and the space (S') between the patterns for the silicon nitride films 14, both of which are used to define the active region, are respectively set to the minimum processing size determined according to the resolution limit of photolithography for the purpose of high integration of the memory cell, the size (a) of the short side of the active region L, which is used as a gate width of each MISFET Qs, reaches the minimum processing size or more. Therefore, the MISFET Qs can be scaled down. Thus, the wiring pitch (Lw'+Ls') lying in the direction of the bit line BL is set to twice the minimum processing size to achieve high integration, and the size (a) of the active region L can be ensured, whereby the MISFET Qs can be scaled down.

Next, gate electrodes 8 (word lines WL) are formed over their corresponding gate oxide films 7, as shown in FIGS. 22A and 22B. The gate electrodes 8 (word line WL) are formed by, for example, depositing a low resistance poly-crystalline silicon film doped with phosphorus (P) over its corresponding gate oxide film 7 by a CVD method, then depositing a WN film and a W film over the low resistance poly-crystalline silicon film by a sputtering method, further depositing a silicon nitride film 9 over those films by the CVD method and thereafter patterning these films by dry etching using a photoresist film as a mask. Each of the gate electrodes 8 (word lines WL) is formed such that the line width (gate length) thereof and space therebetween are respectively set to the minimum size (e.g., 0.16 μm) determined according to the resolution limit of photolithography.

Figure 23:
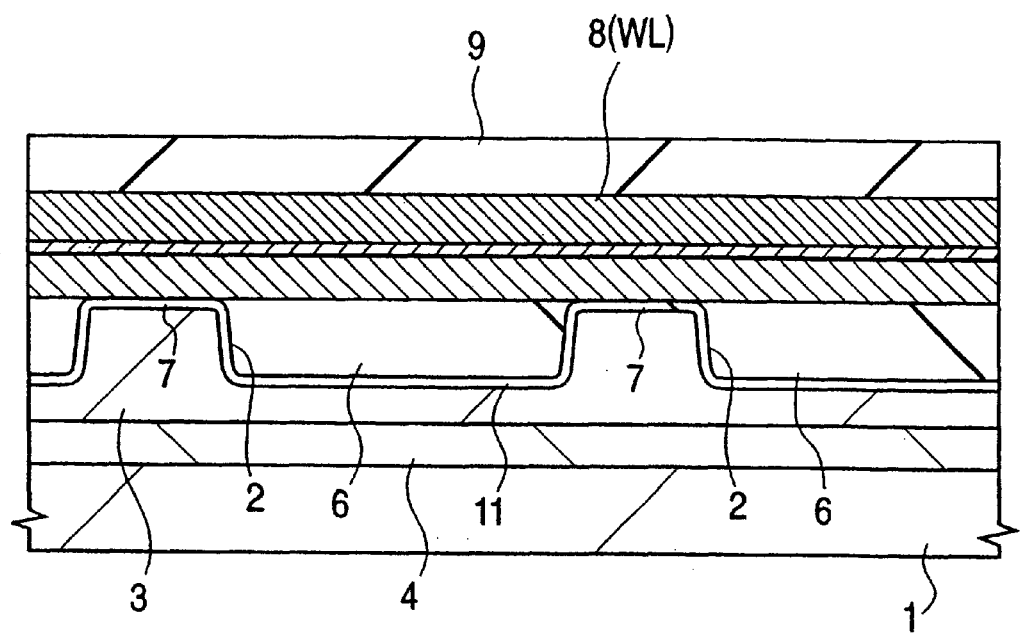
FIG. 23 is a fragmentary cross-sectional view of the substrate, which depicts a step in the method of manufacturing the semiconductor integrated circuit device according to embodiment 1 of the present invention.

FIG. 23 is a cross-sectional view of the substrate 1 as seen along the direction in which the gate electrodes 8 (word lines WL) extend. As shown in the drawing, the word lines WL extend across the short sides of the active regions L and the shallow groove isolations 2 and function as gate electrodes 8 of memory cell selection MISFETs Qs at upper portions of gate oxide films 7 formed on the surface of the substrate I corresponding to the active region L, respectively. Since the surface of the silicon oxide film 6 embedded in each shallow groove isolation 2 is not greatly recessed downwards in the neighborhood of the peripheral portion of the active region L in the present embodiment as described above, the end of the gate oxide film 7 does not reach the side wall of the shallow groove isolation 2 in which an impurity concentration for channel formation is lowered. It is thus possible to prevent the threshold voltage of the memory cell selection MISFET Qs from varying.

Next, an n type impurity (phosphorus or arsenic) is ion-implanted in a p type well 3 to form n type semiconductor regions 10 (sources and drains), whereby the memory cell selection MISFETs Qs shown in FIGS. 1, 3A and 3B are completed.

Next, as shown in FIGS. 24A and 24B, a silicon nitride film 18 having a thickness of from about 50 nm to about 100 nm is deposited over the substrate 1 by the CVD method, and a silicon oxide film 20 having a thickness of about 600 nm is deposited over the silicon nitride film 18 by the CVD method. Thereafter, the silicon oxide film 20 is polished by a CMP method so that the surface thereof is flattened.

Figure 25:
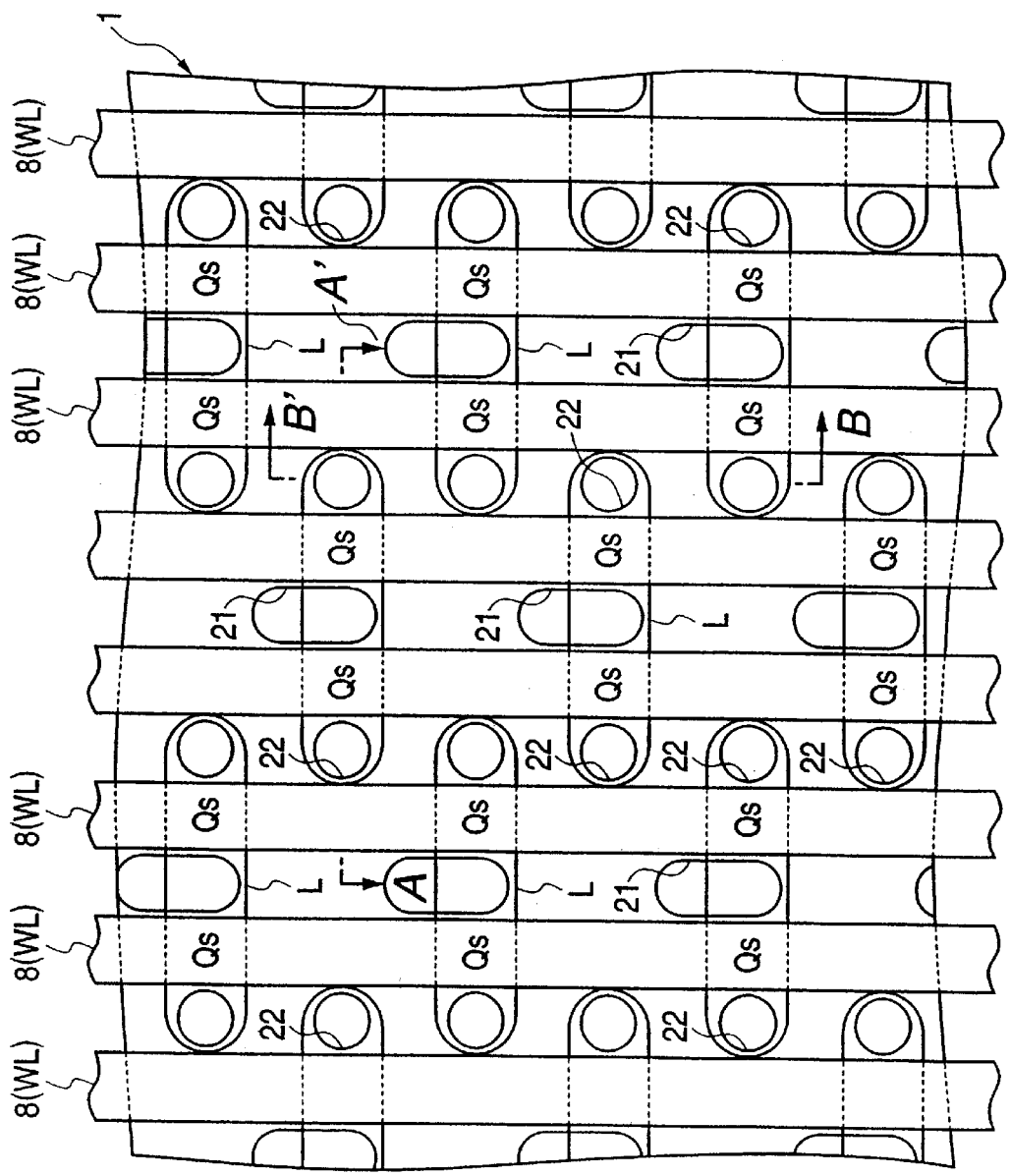
FIG. 25 is a fragmentary plan view of the substrate, which illustrates the method of manufacturing the semiconductor integrated circuit device according to embodiment 1 of the present invention.
Figure 26:
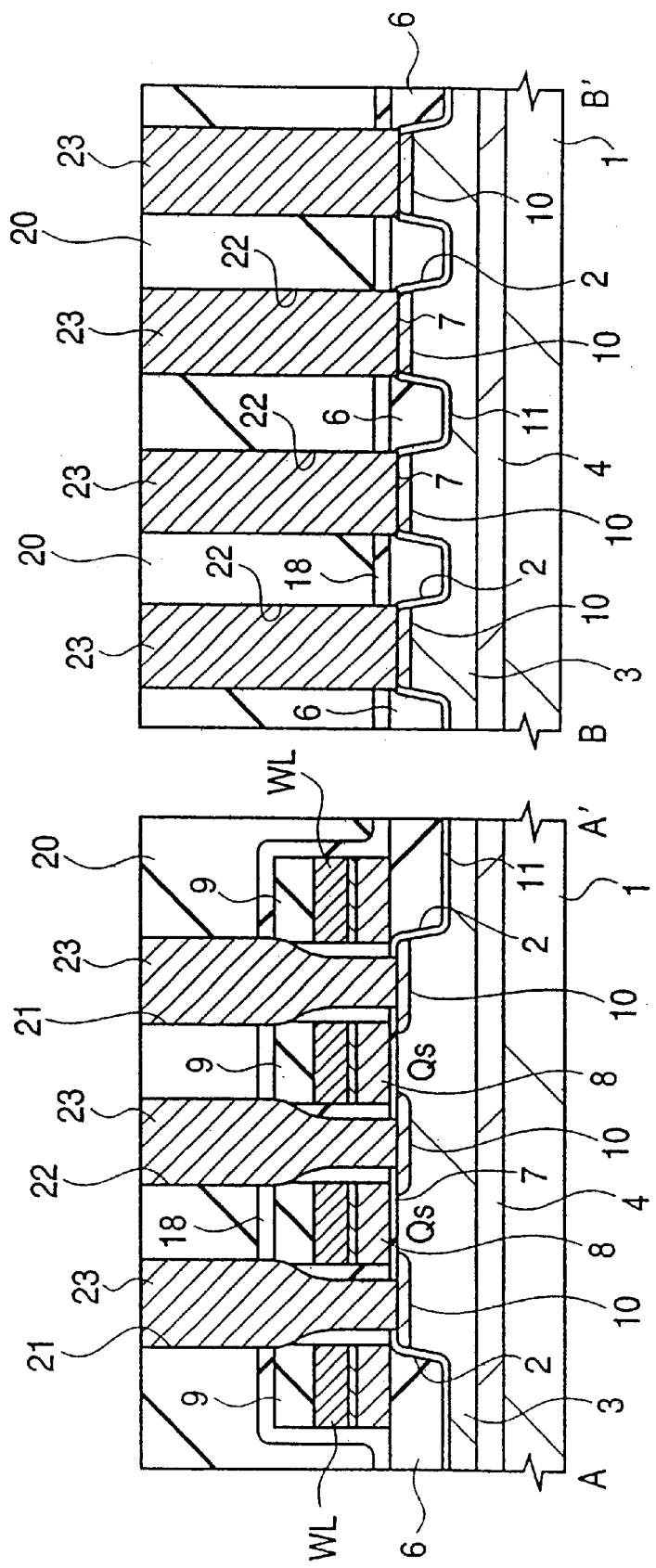
FIGS. 26A and 26B are fragmentary cross-sectional views of the substrate, which show a step in the method of manufacturing the semiconductor integrated circuit device according to embodiment 1 of the present invention.

Next, as shown in FIGS. 25, 26A and 26B, the silicon oxide film 20 and silicon nitride film 18 lying over the sources and drains (n type semiconductor regions 10) of the memory cell selection MISFETs Qs are dry-etched with photoresist films (not shown) as masks to define contact holes 21 over one of the sources and drains (n type semiconductor regions 10) and define contact holes 22 over the other thereof. Thereafter, plugs 23 are respectively formed inside these contact holes 21 and 22. The contact holes 21 and 22 are defined in self alignment with the gate electrodes 8 using the silicon nitride film 18 as an etching mask. Further, the plugs 23 are formed by depositing a low resistance poly-crystalline silicon film doped with an n type impurity such as phosphorus (P) over the silicon oxide film 20, including the interiors of the contact holes 21 and 22, and, thereafter, etching back the poly-crystalline silicon film (or polishing it by the CMP method) to thereby leave it only inside the contact holes 21 and 22.

Figure 27:
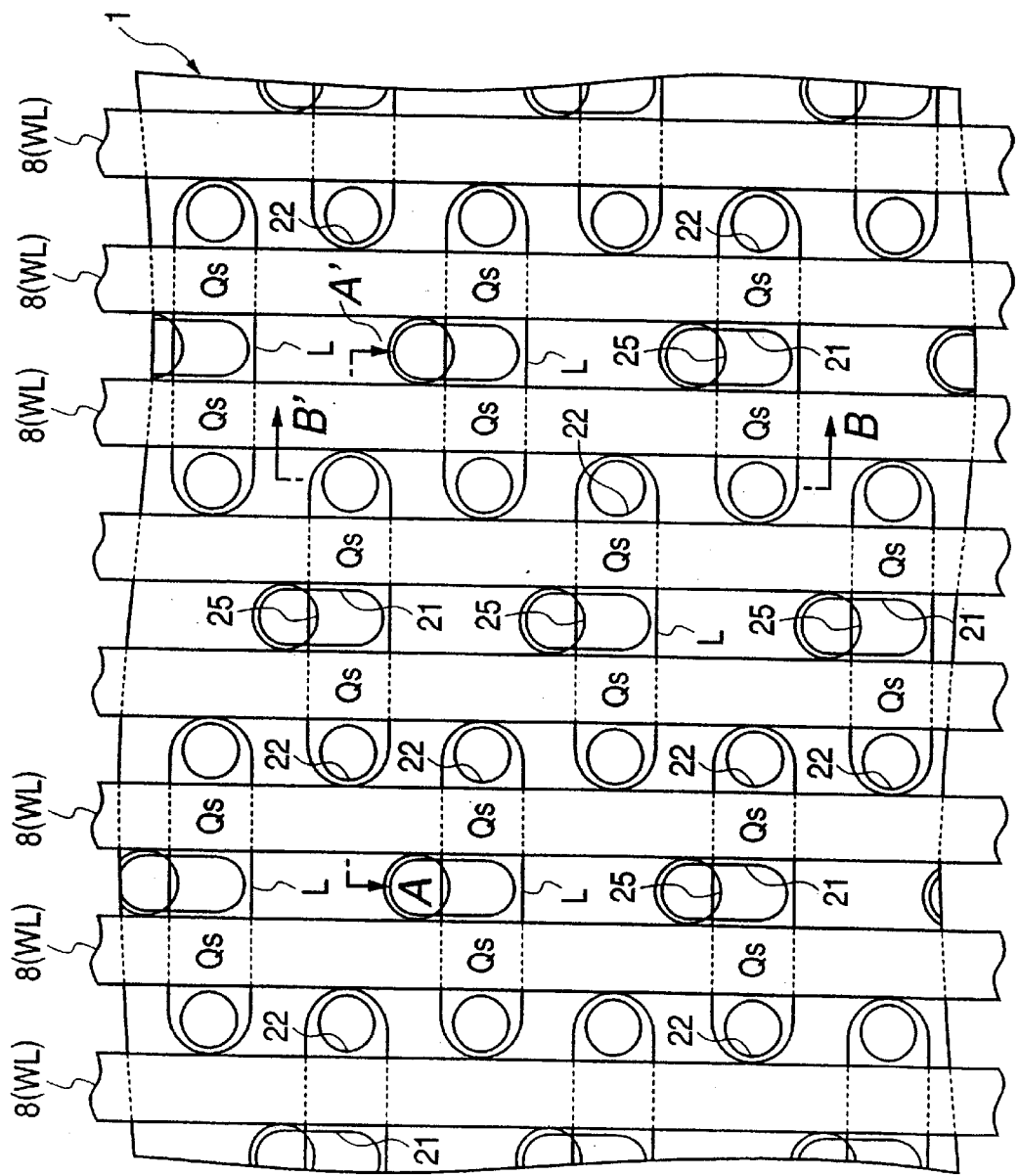
FIG. 27 is a fragmentary plan view of the substrate, which illustrates the method of manufacturing the semiconductor integrated circuit device according to embodiment 1 of the present invention.
Figure 28:
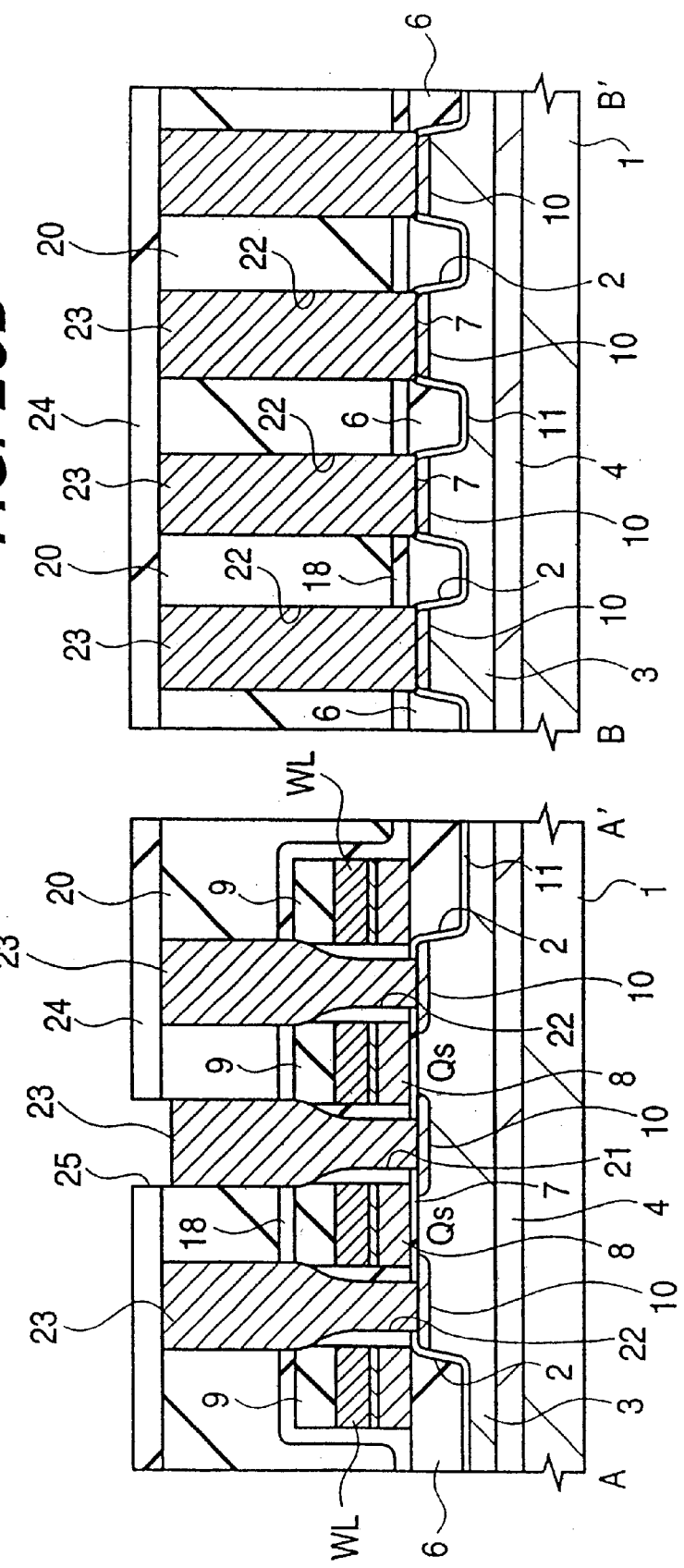
FIGS. 28A and 28B are fragmentary cross-sectional views of the substrate, which depict a step in the method of manufacturing the semiconductor integrated circuit device according to embodiment 1 of the present invention.

Next, as shown in FIGS. 27, 28A and 28B, a silicon oxide film 24 having a thickness of about 200 nm is deposited over the silicon oxide film 20 by the CVD method and, thereafter, dry-etched using a photoresist film (not shown) as a mask, whereby through holes 25 are defined above the contact holes 21 (plugs 23). As shown in FIG. 27, the through holes 25 are formed in such slender patterns that parts thereof extend above the shallow groove isolations 2.

Figure 29:
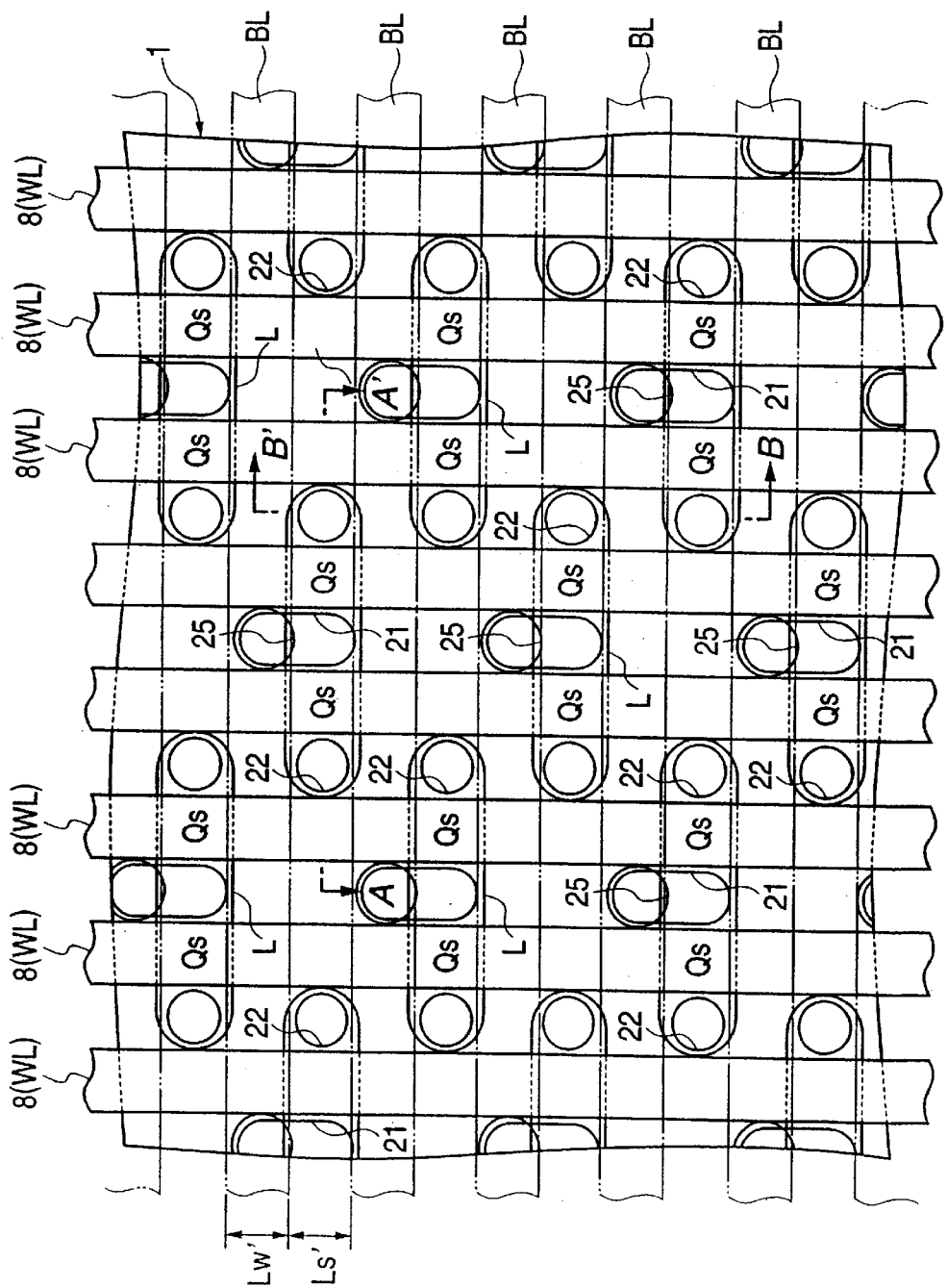
FIG. 29 is a fragmentary plan view of the substrate, which shows the method of manufacturing the semiconductor integrated circuit device according to embodiment 1 of the present invention.
Figure 30A:
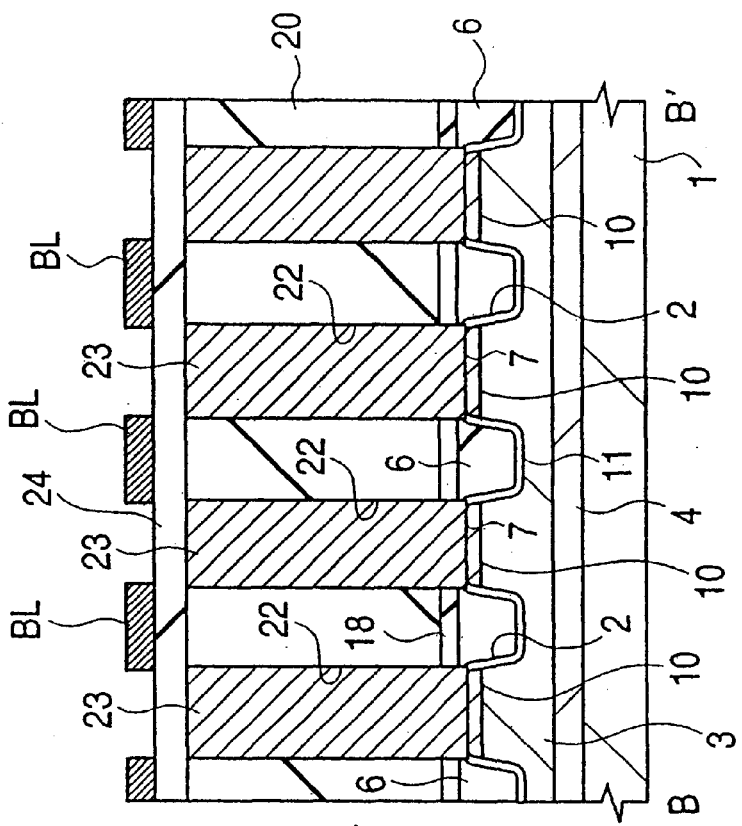
FIGS. 30A and 30B are fragmentary cross-sectional views of the substrate, which show a step in the method of manufacturing the semiconductor integrated circuit device according to embodiment 1 of the present invention.
Figure 30B:
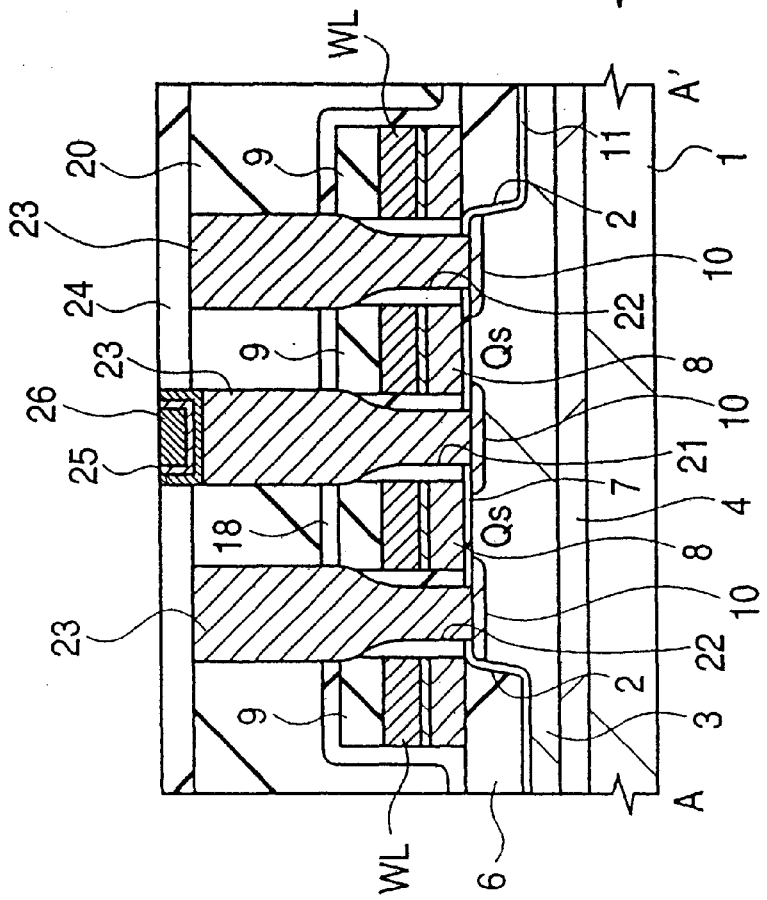

Next, as shown in FIGS. 29, 30A and 30E, plugs 26 are formed inside the through holes 25, and, thereafter, bit lines BL are formed over the silicon oxide film 24. The plugs 26 are formed by depositing a Co film (or Ti film) over the silicon oxide film 24, including the interiors of the through holes 25, by the sputtering method, further depositing a TiN film and a W film thereon by the CVD method, thereafter polishing the W film, TiN film and Co film (or Ti film) lying over the silicon oxide film 24 by the CMP method, and leaving these films only inside the through holes 25.

Further, the bit lines BL are formed by depositing a W film having a thickness of about 200 nm over the silicon oxide film 24 by the sputtering method and, thereafter, dry etching the W film using a photoresist film (not shown) as a mask. The bit lines BL are formed so as to linearly extend along the direction (direction taken along line A–A') orthogonal to the gate electrodes 8 (word lines WL) at the same line widths and same intervals or spaces. The width Lw' of each bit line BL and space Ls' defined between the adjacent bit lines BL are respectively defined as the minimum size (e.g., 0.16 $\mu$m=Lw'=Ls'=Lw=Ls) determined according to the resolution limit of photolithography.

Figures 31A, 31B:
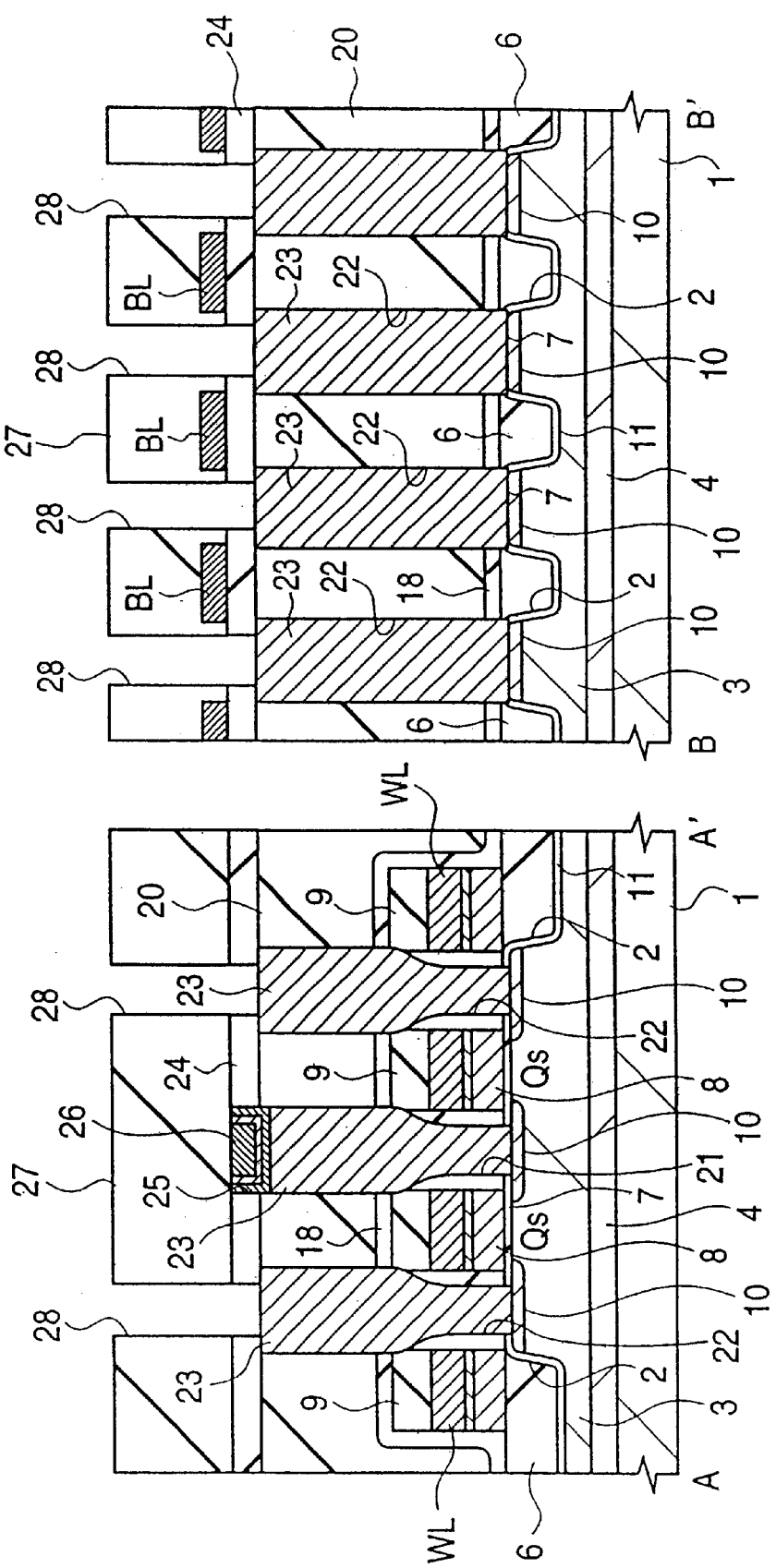
FIGS. 31A and 31B are fragmentary cross-sectional views of the substrate, which illustrate a step in the method of manufacturing the semiconductor integrated circuit device according to embodiment 1 of the present invention.

Next, as shown in FIGS. 31A and 31B, a silicon oxide film 27 having a thickness of about 300 nm is deposited over each but line BL by the CVD method. Thereafter, the silicon oxide film 27 and the silicon oxide film 24 provided therebelow are dry-etched to thereby form through holes 28 above the contact holes 22 (plugs 26).

In order to prevent plugs 29, to be formed inside the through holes 28 in the next process, and the bit lines BL from being short-circuited, the through holes 28 are defined to have a diameter smaller than the minimum size determined according to the resolution limit of photolithography. The through hole 28 having such a minute diameter is defined by the following method, for example.

First of all, a silicon oxide film 27 is deposited over each bit line BL and, thereafter, a first poly-crystalline silicon film (not shown) is deposited over the silicon oxide film 27. Next, the poly-crystalline silicon film is dry-etched using a photoresist film as a mask, whereby through holes are defined in the poly-crystalline silicon film just above the contact holes 22 (plugs 26). The diameter of each through hole will be defined as the minimum size determined according to the resolution limit of photolithography.

Next, a second poly-crystalline silicon film is deposited over the first poly-crystalline silicon film including the interiors of the through holes and, thereafter, anisotropically etched to thereby leave it only on inner walls of the through holes, whereby side wall spacers are formed on the inner walls of the through holes. Thus, the diameter of each through hole becomes smaller than the minimum size determined according to the resolution limit of photolithography.

Next, through holes 28 are defined in the silicon oxide film 27 at the bottoms thereof and the silicon oxide film 24 located in a layer therebelow by dry etching using the first poly-crystalline silicon film and side wall spacers as masks. Thereafter, the unnecessary first poly-crystalline silicon film and side wall spacers are removed by etching.

Next, as shown in FIGS. 32A and 32B, plugs 29 are formed inside the through holes 28, and, thereafter, a silicon nitride film 30 having a thickness of about 100 nm is deposited over its corresponding silicon oxide film 27 by the CVD method. Continuously, a thick silicon oxide film 31 having a thickness of about 1.3 $\mu$m is deposited over the silicon nitride film 30 by the CVD method. The plugs 29 are formed by, for example, depositing a low resistance poly-crystalline silicon film doped with an n type impurity, such as phosphorus (P), over the silicon oxide film 27, including the interiors of the through holes 28, and etching back the poly-crystalline silicon film to thereby leave it only inside the through holes 28. Further, the silicon nitride film 30 is used as an etching stopper upon dry etching the silicon oxide film 31 in the next process.

Figures 33A, 33B:
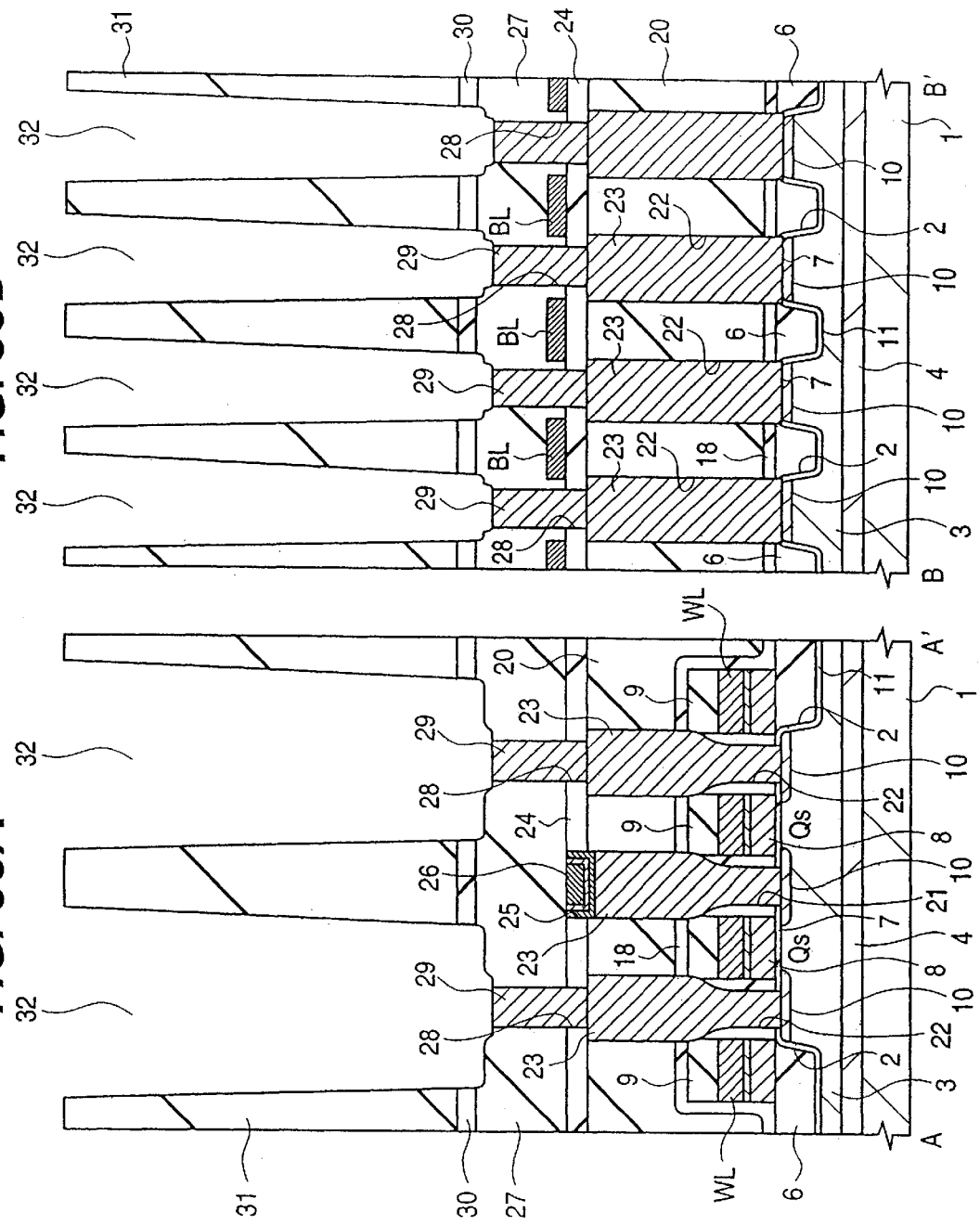
FIGS. 33A and 33B are fragmentary cross-sectional views of the substrate, which depict a step in the method of manufacturing the semiconductor integrated circuit device according to embodiment 1 of the present invention.

Next, as shown in FIGS. 33A and 33B, the silicon oxide film 31 is dry-etched using a photoresist film (not shown) as a mask, and, thereafter, the silicon nitride film 30 lying in a layer below the silicon oxide film 31 is wet-etched to thereby define trenches or grooves 32 above the through holes 28.

Next, as shown in FIGS. 34A and 34B, a low resistance poly-crystalline silicon film having a thickness of about 50 nm, which is doped with the n type impurity, such as phosphorus (P), is deposited over the silicon oxide films 31 including the interiors of the grooves 32 by the CVD method, and, thereafter, the poly-crystalline silicon film above the silicon oxide films 31 is removed by etchback, whereby lower electrodes 33 are formed along inner walls of the grooves 32.

Next, as shown in FIGS. 35A and 35B, a capacitive insulating film 34 comprised of, for example, a tantalum oxide film and an upper electrode 35 comprised of, for example, a TiN film are formed over the lower electrodes 33. In order to form the capacitive insulating film 34 and the upper electrode 35, a thin tantalum oxide film having a thickness of about 20 nm is first deposited over the silicon oxide films 31, including the interiors of the grooves 32, and a TiN film is then deposited over the tantalum oxide film by the CVD method and sputtering method, whereby the TiN film is embedded inside the grooves 32 without any space. Thereafter, the TiN film and tantalum oxide film are patterned by dry etching using a photoresist film (not shown) as a mask. Thus, each information storage capacitative element C comprising the lower electrode 33 comprised of the poly-crystalline silicon film, the capacitive insulating film 34 comprised of the tantalum oxide film and the upper electrode 35 comprised of the TiN film is formed. According to the processes up to now, each memory cell in the DRAM, which is comprised of the memory cell selection MISFET Qs and the information storage capacitative element C connected in series with it, is completed.

Thereafter, Al (aluminum) wires or interconnections corresponding to two layers or so are formed over the information storage capacitative element C, and a surface protective film is further formed over the Al interconnections. However, their illustrations will be omitted.

(Embodiment 2)

Figure 36:
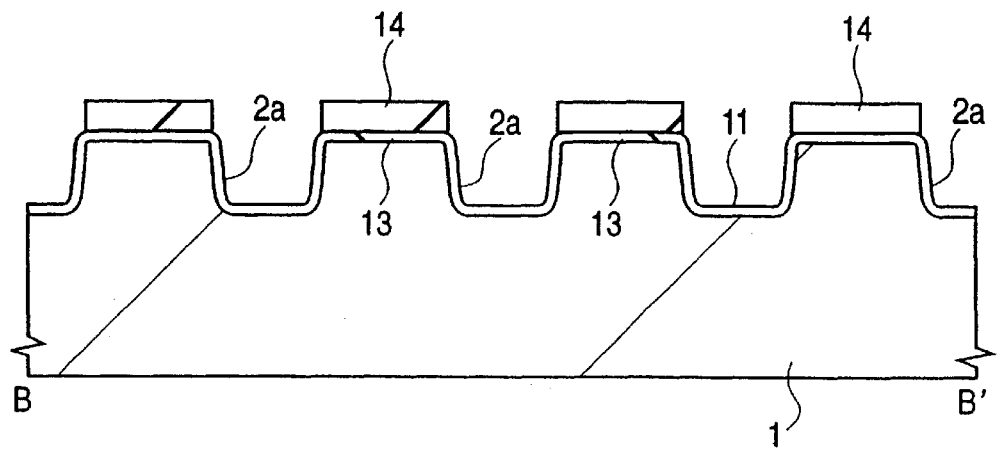
FIG. 36 is a fragmentary cross-sectional view of a substrate, which depicts a step in the method of manufacturing a semiconductor integrated circuit device according to an embodiment 2 of the present invention.

FIG. 36 is a cross-sectional view of a substrate 1, which shows a state in which grooves 2a are defined in the substrate 1 corresponding to device isolation regions by dry etching using silicon nitride films 14 and side wall spacers 16 (unillustrated in the same drawing) formed on their side walls as masks; the side wall spacers 16 are then removed by wet etching; and, thereafter, the substrate 1 is subjected to thermal oxidation, whereby a thin silicon oxide film 11 is formed on inner walls of the grooves 2a and the surface of the substrate 1 corresponding to a peripheral portion of each active region L is subjected to round processing. Processes used up to now are the same as those (see FIGS. 4A through 13B) described with reference to the aforementioned embodiment 1.

Figure 37:
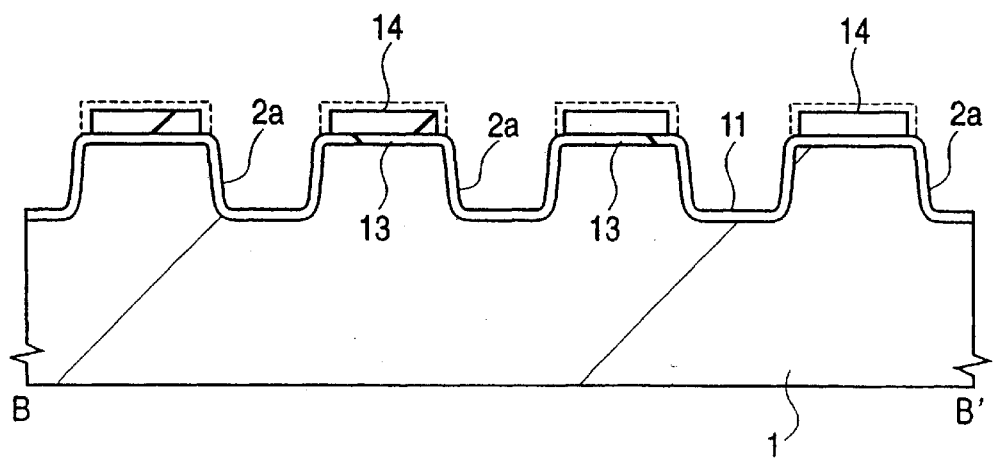
FIG. 37 is a fragmentary cross-sectional view of the substrate, which shows a step in the method of manufacturing the semiconductor integrated circuit device according to embodiment 2 of the present invention.

Next, the silicon nitride films 14 are isotropically etched by a dry etching process or the like as shown in FIG. 37. Owing to the present etching, the size of the silicon nitride film 14 is reduced and its peripheral portion is recessed toward the central side of each active region L. While the recessed amount of the silicon nitride film 14 is set to about 20 nm, for example, it may be determined in consideration of the amount in which a silicon oxide film 6 to be embedded inside the grooves 2a in the subsequent process is recessed to the substrate 1 side in a process up to the formation of a gate oxide film 7 on the surface of the substrate 1 corresponding to each active region L.

Figure 38:
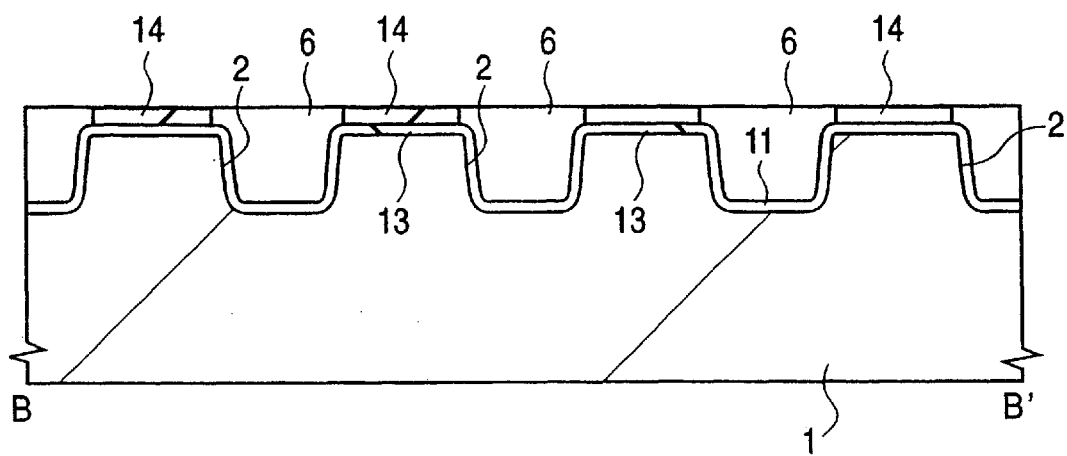
FIG. 38 is a fragmentary cross-sectional view of the substrate, which illustrates a step in the method of manufacturing the semiconductor integrated circuit device according to embodiment 2 of the present invention.

According to the processes (see FIGS. 14A, 14B and 15A, 15B) described with reference to the embodiment 1, the silicon oxide film 6 is next deposited over the substrate 1 including the interiors of the grooves 2a by a CVD method, and then densifying is performed for improving the quality of the silicon oxide film 6. Thereafter, the silicon oxide film 6 lying above the grooves 2a is polished by a CMP method so that the surface thereof is flattened. According to the processes used up to now, shallow groove isolations 2 with the silicon oxide films 6 embedded inside the grooves 2a are substantially completed (see FIG. 38).

Figure 39:
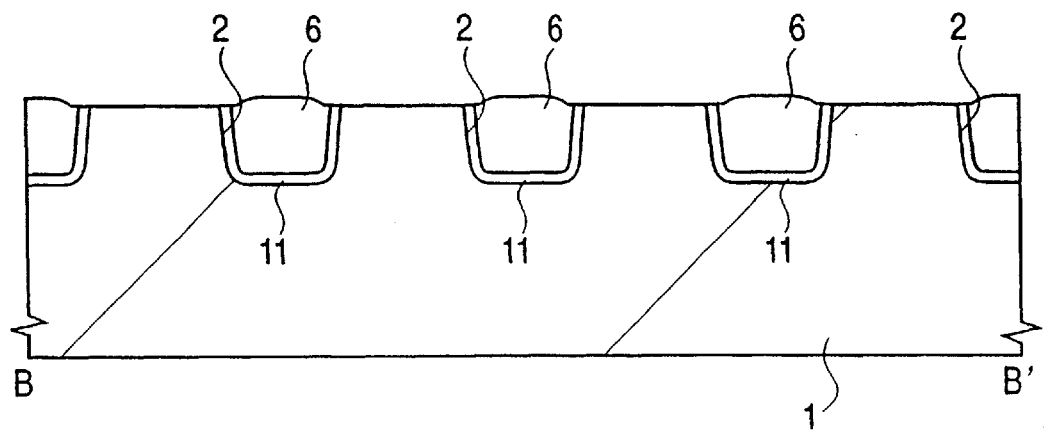
FIG. 39 is a fragmentary cross-sectional view of the substrate, which depicts a step in the method of manufacturing the semiconductor integrated circuit device according to embodiment 2 of the present invention.

Next, the silicon nitride films 14 covering the substrate 1 corresponding to each active region L are removed by wet etching using thermal phosphoric acid in a manner similar to the embodiment 1, whereby silicon oxide films 13 located therebelow are made bare or exposed. When such etching is done, a step having a height equivalent to the remaining thickness of each silicon nitride film 14 occurs between the surface of the silicon oxide film 13 and the surface of the silicon oxide film 6 embedded in the shallow groove isolation 2. However, when the silicon oxide film 13 lying over the surface of the substrate 1 corresponding to the active region L is wet-etched by hydrofluoric acid, the surface of the substrate 1 corresponding to the active region L is exposed, and, at the same time, the surface of each silicon oxide film 6 is etched, so that such a step is reduced (see FIG. 39).

When the above-described wet etching is performed, the end of each silicon oxide film 6 lying within the shallow groove isolation 2, i.e., the sides as well as the upper surface of the silicon oxide film 6 lying in the region which has contacted the silicon nitride film 14, are also subjected to hydrofluoric acid. Therefore, the etched amount increases as compared with each portion away from the active region L. However, since the periphery of the silicon nitride film 14 is recessed to the central side of each active region L and the amount of an offset between a peripheral portion of the active region L and a peripheral portion of the silicon nitride film 14 is made sufficiently great in advance in the present embodiment, the end of each silicon oxide film 6, at the time that the silicon nitride film 14 has been removed, is located on the side much nearer the center of the active region L than the peripheral portion of the active region L. Therefore, even if the end of the silicon oxide film 6 is recessed to the shallow groove isolation 2 side by wet etching for reducing each step referred to above, the silicon oxide film 6 is not greatly recessed downwards at the end of each shallow groove isolation 2. Since the subsequent processes are identical to those employed in the aforementioned embodiment 1, the description thereof will be omitted.

Thus, according to the present embodiment, since it is possible to prevent the occurrence of a failure in which the surface of the silicon oxide film 6 lying within each shallow groove isolation 2 is recessed downwards in the neighborhood of the active region L, a variation in the threshold voltage of each memory cell selection MISFET Qs can be controlled.

A manufacturing method according to the present embodiment, for recessing the peripheral portion of the silicon nitride film 14 to the central side of each active region L, to thereby increase the amount of the off-set between the peripheral portion of the active region L and the peripheral portion of the silicon nitride film 14, is particularly effective as a countermeasure against the case in which a design rule for MISFETs becomes extremely fine and the mere formation of the side wall spacers 16 on the side walls of the silicon nitride films 14 disenables control on the recessing of each silicon oxide film 6 at the end of the shallow groove isolation 2.

Incidentally, it is desirable to perform the recessing of the silicon nitride films 14 due to the above-described isotropic etching after the execution of the thermal oxidation process for rounding the surface of the substrate 1 at the peripheral portion of each active region L. Since the surface of the substrate 1 corresponding to the inner walls of the grooves 2a is also etched to some extent and is isotropically recessed when the dry etching for recessing the silicon nitride films 14 is performed before the round processing, i.e., before the silicon oxide film 11 is formed on the inner wall of each groove 2a by the thermal oxidation process, the size of the active region L might be reduced.

(Embodiment 3)

A description will next be made of an embodiment in which the present invention is applied to a process for manufacturing an LSI (hereinafter called "DRAM-LOGIC mixed LSI") in which a DRAM and a logic LSI are formed on the same substrate.

The operation of the logic LSI at a high speed needs to have a gate oxide film formed as thin as possible. On the other hand, the DRAM requiring a high voltage upon a rise in the potential on each word line is not able to so reduce the thickness of the gate oxide film in terms of ensuring a withstand voltage. Thus, when the DRAM-LOGIC mixed LSI is manufactured, it is necessary to form at least two types of MISFETs that are different from each other in the thickness of the gate oxide film.

In a process for forming two types of gate oxide films different in thickness on the same substrate, a region for forming a thin gate oxide film on the substrate and a region for forming a thick gate oxide film thereon are different from each other in the amount of recessing of the silicon oxide film within each shallow groove isolation. It is therefore necessary to take measures for uniformizing the amount of recessing between the region for forming the thin gate oxide film and the region for forming the thick gate oxide film in terms of prevention of a variation in the characteristic of each MISFET.

Figure 40A:
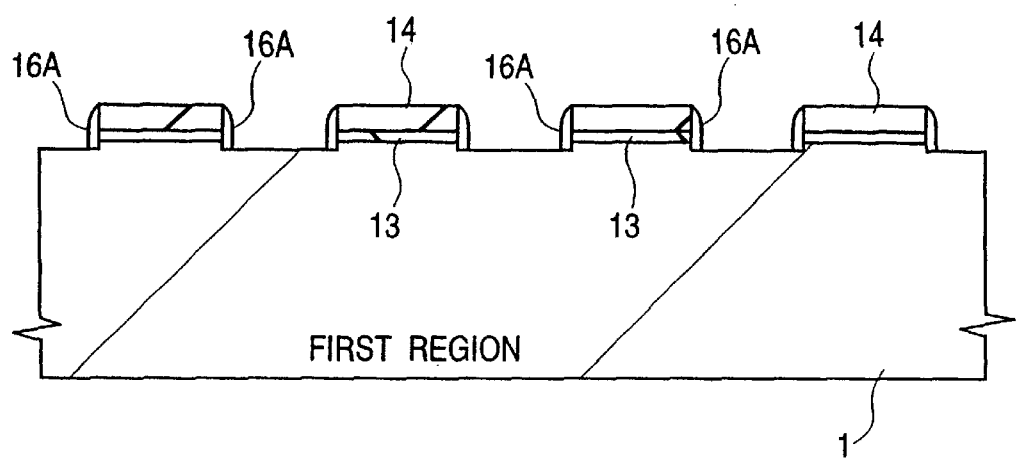
FIGS. 40($a$) and 40($b$) are, respectively, fragmentary cross-sectional views of substrates, which show a step in the method of manufacturing a semiconductor integrated circuit device according to an embodiment 3 of the present invention.
Figure 40B:
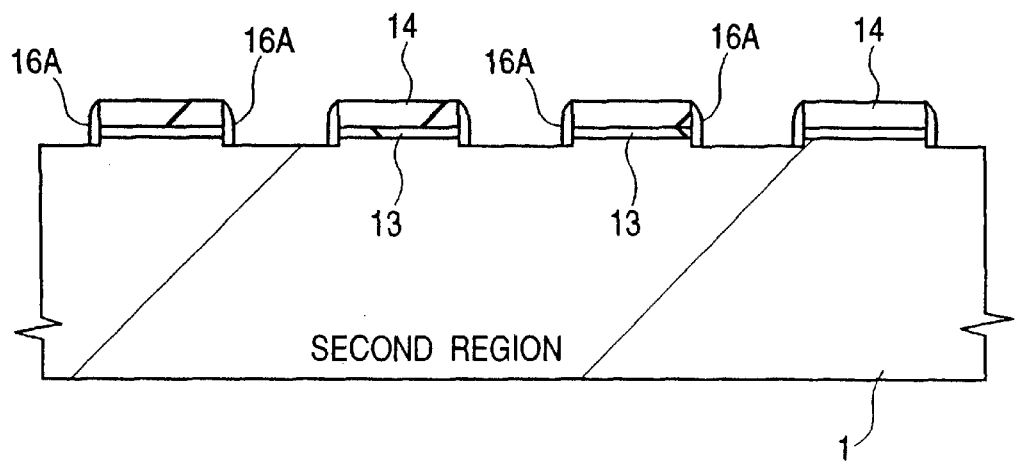

FIGS. 40(a) and 40(b) are a cross-sectional views of a substrate 1 in which, according to the processes (see FIGS. 4A through 8) described with reference to the embodiment 1, silicon nitride films 14 are formed on the substrate 1 having active regions L with silicon oxide films 13 interposed therebetween, and, thereafter, side wall spacers 16A each comprised of a silicon oxide film are formed on their side walls. Here, FIG. 40(a) shows the substrate 1 having a logic region (first region) for forming a thin gate oxide film, and FIG. 40(b) illustrates the substrate 1 having a DRAM region (second region) for forming a thick gate insulating film. The processes used up to now are identical in the logic and DRAM regions.

Figure 41A:
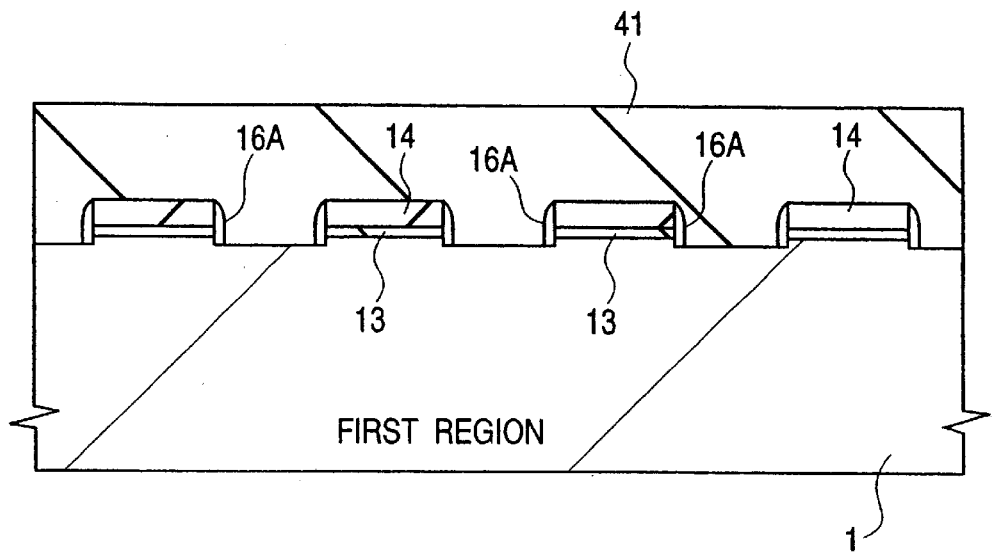
FIGS. 41($a$) and 41($b$) are, respectively, fragmentary cross-sectional views of the substrates, which show a step in the method of manufacturing the semiconductor integrated circuit device according to embodiment 3 of the present invention.
Figure 41B:
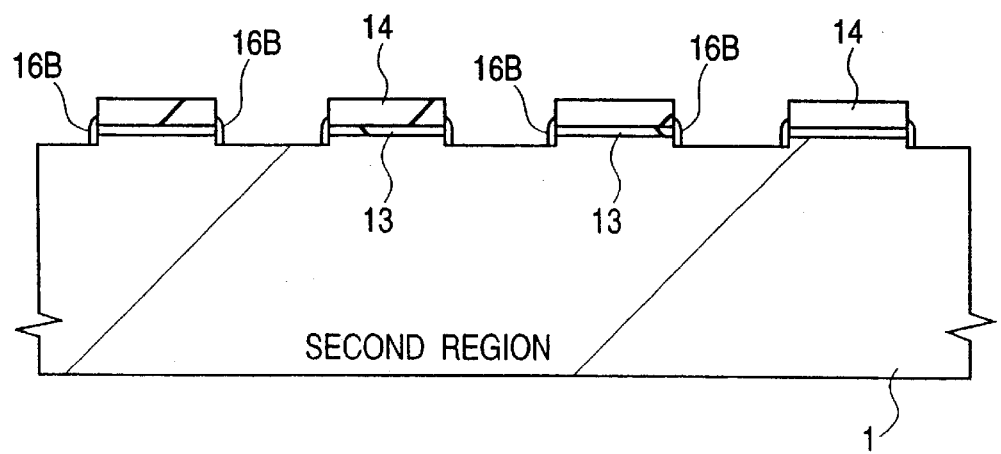

Next, as shown in FIG. 41(a), the substrate 1 having the logic region is covered with a photoresist film 41 and the side wall spacers 16A formed on the side walls of the silicon nitride films 14 in the DRAM region are etched, thereby thinning their film thicknesses (spacer lengths). Thus, two types of side wall spacers 16A and 16B that are different in spacer length are formed in the logic and DRAM regions, as seen by comparing FIG. 41(a) and FIG. 41(b).

Figure 42A:
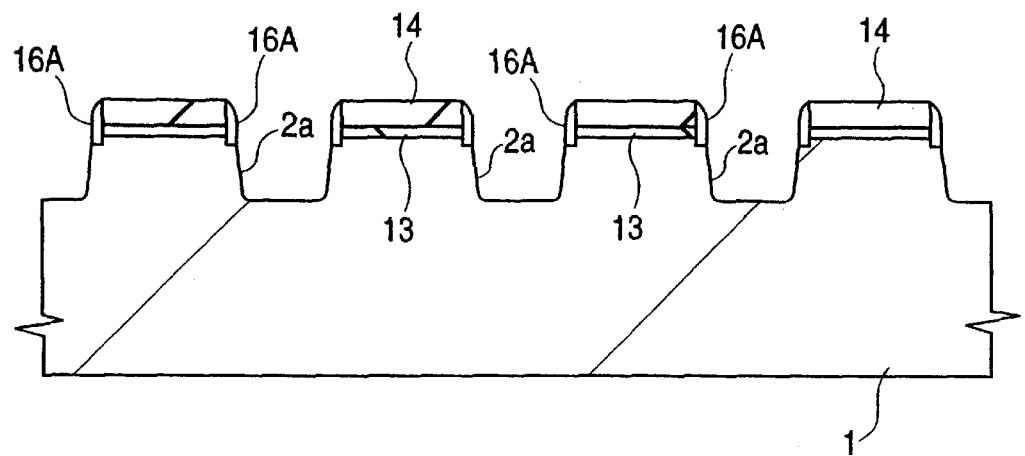
FIGS. 42($a$) and 42($b$) are, respectively, fragmentary cross-sectional views of the substrates, which illustrate a step in the method of manufacturing the semiconductor integrated circuit device according to embodiment 3 of the present invention.
Figure 42B:
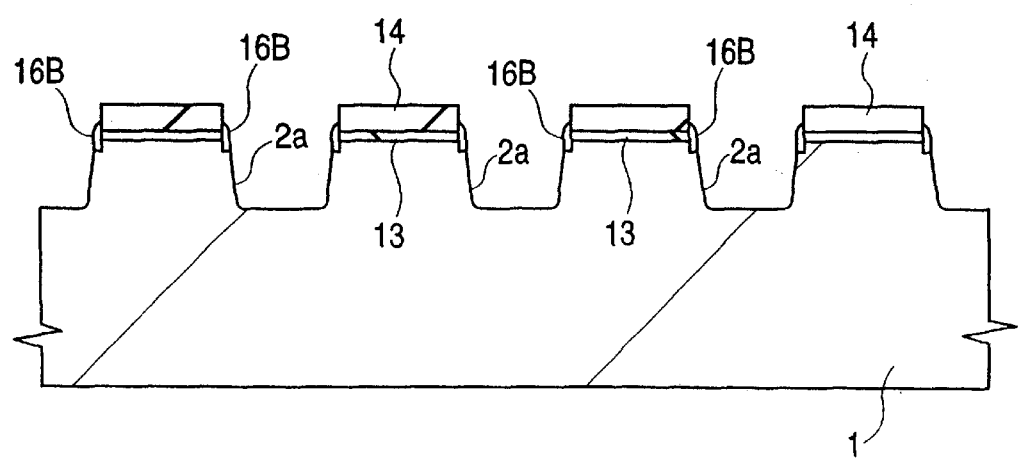

The photoresist film 41 is next removed. Thereafter, as shown in FIGS. 42(a) and 42(b), grooves 2a are thereafter defined in the substrate 1 having the logic region by dry etching using the silicon nitride films 14 and side wall spacers 16A as masks, and grooves 2a are defined in the substrate 1 having the DRAM region by dry etching using the silicon nitride films 14 and side wall spacers 16B as masks. Since, at this time, the side wall spacers 16A and 16B formed on the side walls of the silicon nitride films 14 are different from each other in spacer length, the amount of an offset between a peripheral portion of each active region L and a peripheral portion of the silicon nitride film 14 differ between the logic region and the DRAM region. Namely, the distance from the side wall (corresponding to the peripheral portion of the active region L) of each groove 2a to the peripheral portion of the silicon nitride film 14 becomes large in the logic region in which the side wall spacers 16A thickness are formed.

Figure 43A:
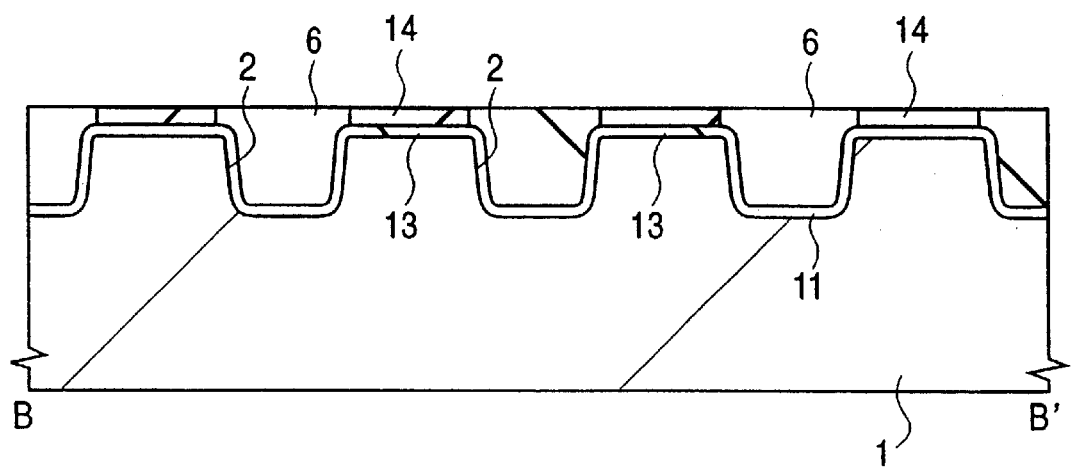
FIGS. 43($a$) and 43($b$) are, respectively, fragmentary cross-sectional views of the substrates, which depict a step in the method of manufacturing the semiconductor integrated circuit device according to embodiment 3 of the present invention.
Figure 43B:
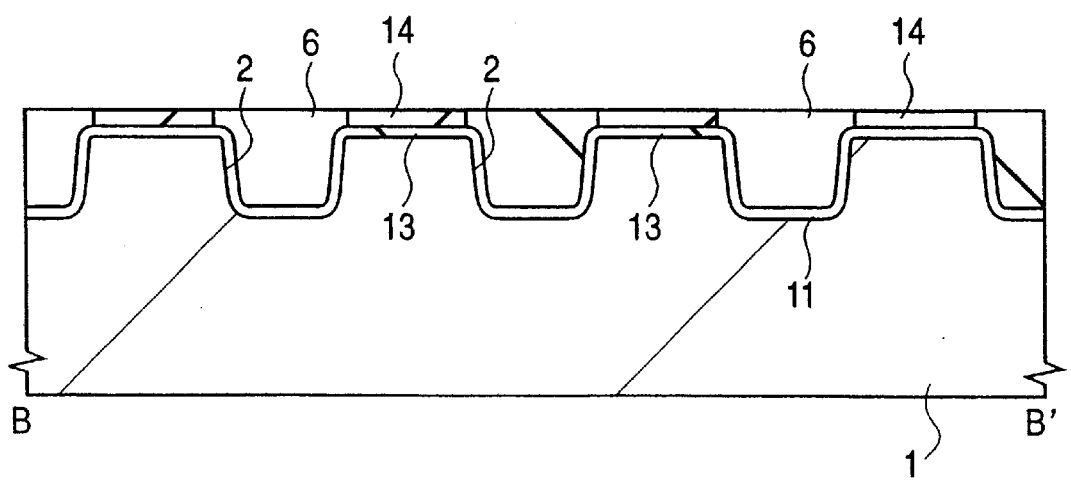

Next, the side wall spacers 16A and 16B formed on the side walls of the silicon nitride films 14 are removed by wet etching using hydrofluoric acid. Thereafter, the substrate 1 is subjected to thermal oxidation in accordance with the processes (see FIGS. 13 through 15B) described with reference to the embodiment 1, as shown in FIGS. 43(a) and 43(b), whereby a thin silicon oxide film 11 is formed on the inner walls of the grooves 2a and the surface of the substrate 1 at the peripheral portion of each active region L is subjected to round processing. Thereafter, a silicon oxide film 6 deposited over the substrate 1, including the interiors of the grooves 2a, is densified, and the silicon oxide films 6 lying above the grooves 2a are then polished by a CMP method, whereby the surfaces thereof are flattened. According to the processes up to now, shallow groove isolations 2 with the silicon oxide films 6 embedded inside the grooves 2a are substantially completed.

As described above, the logic region is larger than the DRAM region in the distance (amount of offset) between the peripheral portion of the active region L and the peripheral portion of the silicon nitride film 14. Therefore, the end of the silicon oxide film 6 lying within each shallow groove isolation 2 is located on the center side of the active region L in the case of the logic region rather than the DRAM region.

Figure 44A:
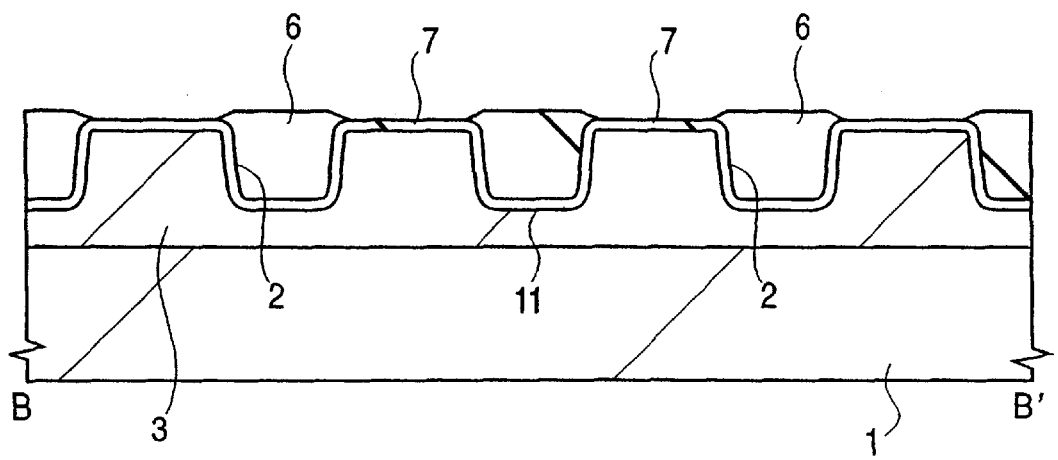
FIGS. 44($a$) and 44($b$) are, respectively, fragmentary cross-sectional views of the substrates, which show a step in the method of manufacturing the semiconductor integrated circuit device according to embodiment 3 of the present invention.
Figure 44B:
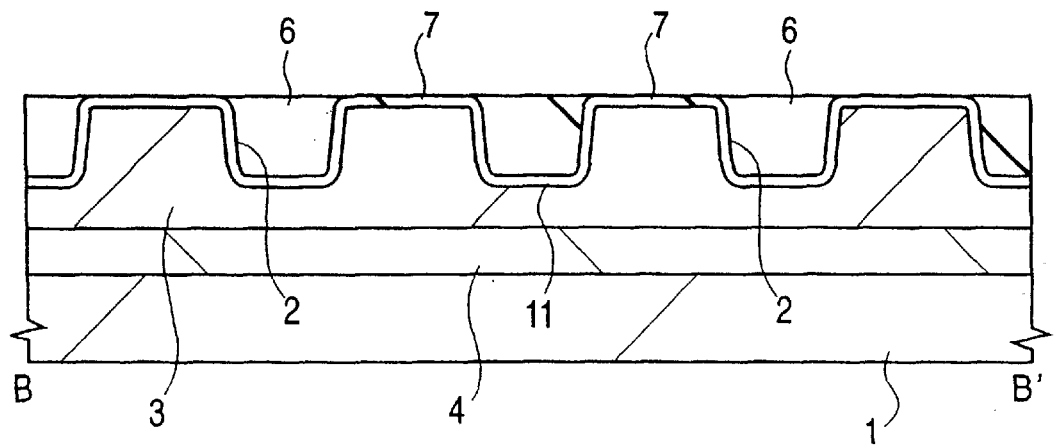

Next, as shown in FIGS. 44(a) and 44(b), the removal of the silicon nitride films 14, the removal of the silicon oxide film 13 by wet etching and the formation of each silicon oxide film 17, ion implantation of an impurity through the silicon oxide film 7 and the formation of wells (p type well 3 and n type well 4) by thermal processing, and the removal of the silicon oxide film 17 by wet etching are performed in accordance with the processes (see FIGS. 16A through 20E) described with reference to the embodiment 1. Thereafter, a clean gate oxide film 7 having a thickness of from about 6 nm to about 7 nm is formed on the surface of the substrate 1 corresponding to the respective active regions L in the logic and DRAM regions.

When the silicon oxide film 13 is wet-etched, the end of each silicon oxide film 6 is recessed toward the shallow groove isolation 2 side. Since the end of the silicon oxide film 6 is located on the center side of each active region L in the case of the logic region rather than the DRAM region, the amount of recessing of the silicon oxide film 6 at the end of the shallow groove isolation 2 is reduced in the case of the logic region.

Figure 45A:
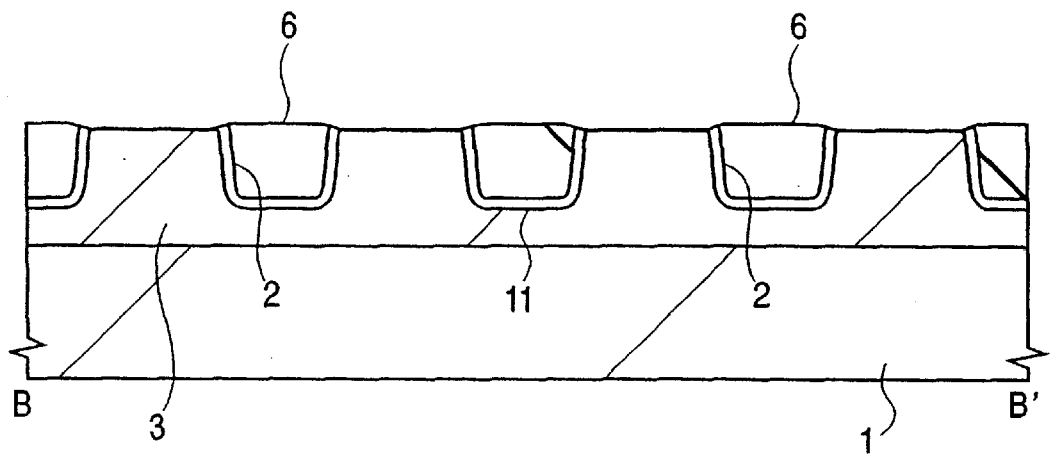
FIGS. 45($a$) and 45($b$) are, respectively, fragmentary cross-sectional views of the substrates, which depict a step in the method of manufacturing the semiconductor integrated circuit device according to embodiment 3 of the present invention.
Figure 45B:
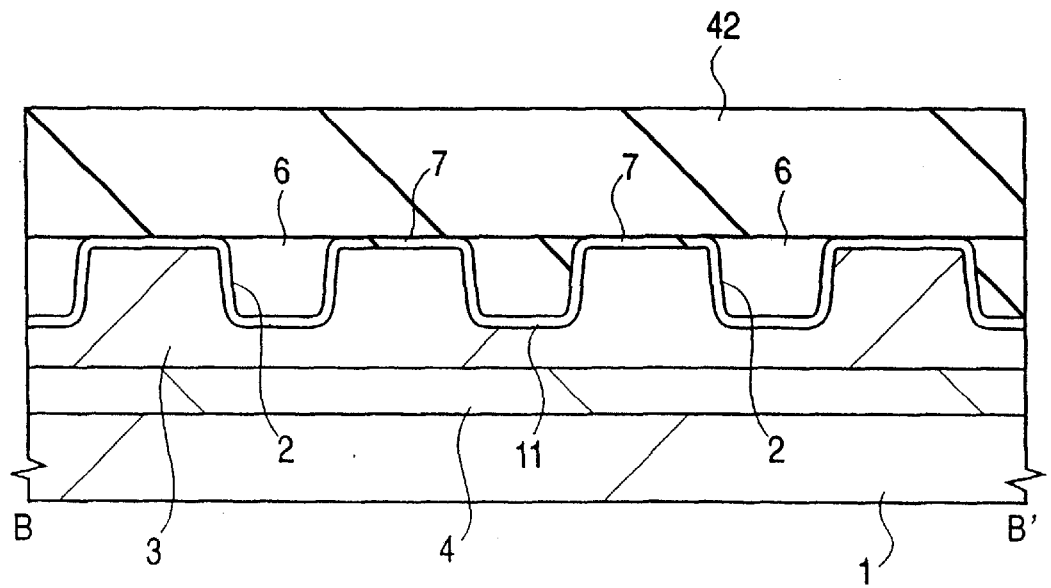

Next, as shown in FIGS. 45(a) and 45(b), the substrate 1 having the DRAM region is covered with a photoresist film 42 and the gate oxide film 7 provided on the surface of the substrate 1 having the logic region is selectively removed by wet etching using hydrofluoric acid, whereby the surface of the substrate 1 is exposed. When such wet etching is done, the surface of each silicon oxide film 6 embedded in the shallow groove isolation 2 in the logic region is also etched simultaneously, and the end thereof is recessed toward the shallow groove isolation 2 side. Since the substrate 1 having the DRAM region is covered with the photoresist film 42 at this time, the gate oxide film 7 formed on the surface of the substrate 1 lying in this region and the silicon oxide film 6 lying within each shallow groove isolation 2 are not etched. As a result, the amount of recessing of the silicon oxide film 6 at the end of each shallow groove isolation 2 becomes substantially identical in the logic and DRAM regions.

Figure 46A:
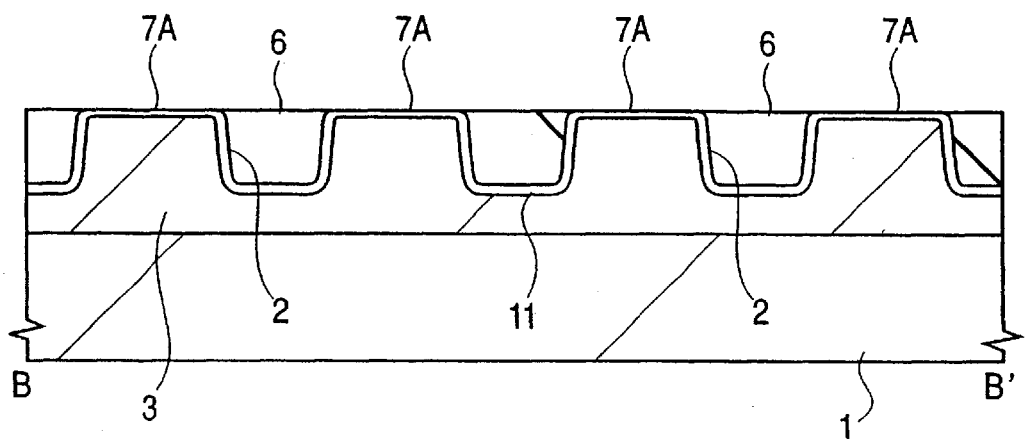
FIGS. 46($a$) and 46($b$) are, respectively, fragmentary cross-sectional views of the substrates, which show a step in the method of manufacturing the semiconductor integrated circuit device according to embodiment 3 of the present invention.
Figure 46B:
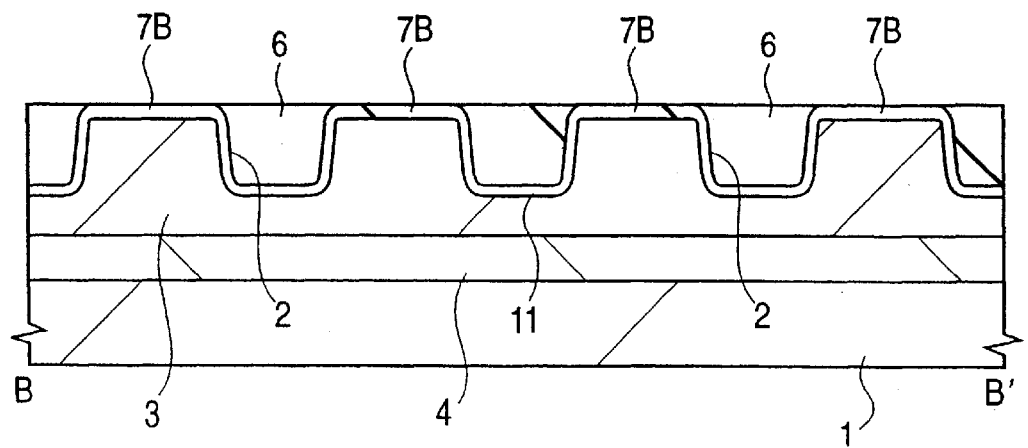

Next, the photoresist film 42 is removed and thereafter the substrate 1 is subjected to thermal oxidation, as shown in FIGS. 46(a) and 46(b), whereby a thin gate oxide film 7A having a thickness of about 4 nm is formed on the surface of the substrate 1 having the logic region. The gate oxide film 7 formed on the surface of the substrate 1 having the DRAM region by thermal oxidation is further oxidized, so that it grows to a thick gate oxide film 7B having a thickness of from about 8 nm to about 9 nm.

Thus, according to the present embodiment, since the amount of recessing of the silicon oxide film 6 at the end of each shallow groove isolation 2 can be uniformized in the logic region for forming each thin gate oxide film 7A and the DRAM region for forming each thick gate oxide film 7B, variations in characteristics of MISFETs formed in the logic region and MISFETs formed in the DRAM region can be reduced.

According to the present embodiment in which the grooves 2a are defined in the substrate 1 in the device isolation regions by dry etching using the silicon nitride films 14 and the side wall spacers 16A and 16B formed on their side walls as masks, an effect similar to that obtained in the embodiment 1 can also be obtained.

While the invention made by the present inventors has been described above specifically with reference to the preferred embodiments, the present invention is not necessarily limited to these embodiments. It is needless to say that various changes can be made thereto within a scope not departing from the substance thereof.

While the embodiments have described for a case in which the invention is principally applied to a DRAM, the present invention is not limited to this. The present invention can be widely applied to various LSIs wherein fine MISFETs are formed on a substrate having shallow groove isolations.

Advantageous effects obtained by typical aspects of the invention disclosed in the present application will be described briefly as follows.

According to the present invention, a peripheral portion of each active region can be subjected to round processing without reducing the size of the active region, thus making it possible to facilitate scale down of MISFETS.

According to the present invention, since it is possible to prevent a failure in which a silicon oxide film lying in each shallow groove isolation is recessed in the neighborhood of a peripheral portion of each active region, the characteristic of a scaled-down MISFET can be improved.

What is claimed:

1. A method of manufacturing a semiconductor integrated circuit device, comprising steps of:
   (a) providing a semiconductor substrate with a first pattern formed over a first portion of a main surface of said substrate, a second pattern formed over a second portion of said main surface, and a first and a second side wall formed on side surfaces of said first and said second patterns, respectively, wherein a width of said first side wall is greater than a width of said second side wall;

(b) forming a first groove, in said substrate, in self-alignment with said first side wall and a second groove, in said substrate, in self-alignment with said second side wall;

(c) burying said first and said second grooves with a first insulating film;

(d) removing said first and said second patterns;

(e) after said step (d), forming a second insulating film over said first portion and said second portion; and (f) after selectively removing said second insulating film formed over said first portion, forming a third insulating film over said second portion such that a thickness of said third insulating film is thinner than a thickness of said second insulating film.

2. A method according to claim 1, wherein said second and said third insulating films are formed by using an oxidation method.

3. A method according to claim 1, wherein each of said second and said third insulating films serves as a gate insulating film of a MISFET.

4. A method according to claim 1, wherein said first portion is an active area for a MISFET included in a logic circuit, and said second portion is an active area for a MISFET included in a memory cell.

5. A method of manufacturing a semiconductor integrated circuit device, comprising steps of:

(a) providing a semiconductor substrate with a first pattern formed over a first portion of a main surface of said substrate, a second pattern formed over a second portion of said main surface, and a first and a second side wall formed on side surfaces of said first and said second patterns, respectively, wherein a width of said first side wall is greater than a width of said second side wall;

(b) forming a first groove, in said substrate, in self-alignment with said first side wall and a second groove, in said substrate, in self-alignment with said second side wall;

(c) burying said first and said second grooves with a first insulating film;

(d) removing said first and said second patterns;

(e) after said step (d), forming a second insulating film over said first portion and said second portion by thermal oxidation; and (f) after selectively removing said second insulating film formed over said first portion, forming a third insulating film over said second portion by thermal oxidation such that a thickness of said third insulating film is thinner than a thickness of said second insulating film.

6. A method according to claim 5, wherein each of said second and said third insulating films serves as a gate insulating film of a MISFET.

7. A method according to claim 6, wherein said first portion is an active area for a MISFET included in a logic circuit, and said second portion is an active area for a MISFET included in a memory cell.

8. A method of manufacturing a semiconductor integrated circuit device, comprising steps of:

(a) providing a semiconductor substrate with a first pattern formed over a first portion of a main surface of said substrate, and a second pattern formed over a second portion of said main surface;

(b) forming a first and a second side wall formed on side surfaces of said first and second patterns, respectively, wherein a width of said first side wall is greater than a width of said second side wall;

(c) forming a first groove, in said substrate, in self-alignment with said first side wall and a second groove, in said substrate, in self-alignment with said second side wall;

(d) burying said first and second grooves with a first insulating film;

(e) removing said first and said second patterns;

(f) after said step (e), forming a second insulating film over said first portion and said second portion; and (g) after selectively removing said second insulating film formed over said first portion, forming a third insulating film over said second portion such that a thickness of said third insulating film is thinner than a thickness of said second insulating film.

9. A method according to claim 8, wherein said second and said third insulating films are formed by using an oxidation method.

10. A method according to claim 8, wherein each of said second and said third insulating films serves as a gate insulating film of a MISFET.

11. A method according to claim 8, wherein said first portion is an active area for a MISFET included in a logic circuit, and said second portion is an active area for a MISFET included in a memory cell.

12. A method of manufacturing a semiconductor integrated circuit device, comprising steps of:

(a) forming a first pattern over a first portion of a main surface of a semiconductor substrate;

(b) forming a second pattern over a second portion of said main surface of said substrate;

(c) forming a first side wall on a side surface of said first pattern;

(d) forming a second side wall on a side surface of said second pattern such that a width of said first side wall is greater than a width of said second side wall;

(e) forming a first groove, in said substrate, in self-alignment with said first side wall;

(f) forming a second groove, in said substrate, in self-alignment with said second side wall;

(g) burying said first and said second groove with an insulating film; and (h) forming a first gate insulating film over said first portion and a second gate insulating film over said second portion such that a thickness of said second gate insulating film is thinner than a thickness of said first gate insulating film.

13. A method according to claim 12, wherein said first and said second gate insulating film are formed by using an oxidation method and each serves as a gate insulating film of a MISFET.

14. A method according to claim 12, wherein said first portion is an active area for a MISFET constituting a logic circuit, and said second portion is an active area for a MISFET constituting a memory cell.

15. A method of manufacturing a semiconductor integrated circuit device including a first MISFET formed on a first portion of a main surface of a semiconductor substrate and a second MISFET formed on a second portion of said main surface, wherein a thickness of a first gate insulating film of said first MISFET is greater than a thickness of a second gate insulating film of said second MISFET, comprising steps of:

(a) forming a first pattern over said first portion;

(b) forming a second pattern over said second portion;

(c) forming a first side wall on a side surface of said first pattern;

(d) forming a second side wall on a side surface of said second pattern such that a width of said first side wall is greater than a width of said second side wall;

(e) forming a first groove, in said substrate, in self-alignment with said first side wall;

(f) forming a second groove, in said substrate, in self-alignment with said second side wall; and (g) burying said first and said second groove with an insulating film.

16. A method according to claim 15, wherein said first portion is an active area for a MISFET constituting a logic circuit, and wherein said second portion is an active area for a MISFET constituting a memory cell.

17. A method of manufacturing a semiconductor integrated circuit device, comprising steps of:

(a) forming a pattern over a first portion of a main surface of a semiconductor substrate;

(b) introducing an impurity, in self-alignment with said pattern, in a second portion of said substrate uncovered by said pattern;

(c) forming a groove, in said substrate, in self-alignment with said pattern;

(d) rounding an edge portion of said groove by using a heat treatment; and (e) burying said groove with an insulating film.

18. A method according to claim 17, wherein, in said step (b), said impurity is introduced by ion implantation, diagonally with respect to a main surface of said substrate, in a portion of said substrate under said pattern.

19. A method according to claim 17, wherein in said step (b), said impurity is introduced to damage said edge portion of said groove.

20. A method according to claim 19, wherein the mass of said impurity is greater than the mass of silicon.

21. A method according to claim 19, wherein in said step (d), said edge portion of said groove is rounded by using said heat treatment to cover said damaged edge portion.

22. A method according to claim 17, wherein, in said step (b), said impurity is introduced by ion implantation, diagonally with respect to a main surface of said substrate, in said edge portion of said groove.

23. A method according to claim 18, wherein in said step (b), said impurity is introduced to damage said edge portion of said groove.

24. A method according to claim 23, wherein in said step (d), said edge portion of said groove is rounded by using said heat treatment to cover said damaged edge portion.

25. A method according to claim 22, wherein in said step (b), said impurity is introduced to damage said edge portion of said groove.

26. A method according to claim 25, wherein in said step (d), said edge portion of said groove is rounded by using said heat treatment to cover said damaged edge portion.

27. A method of manufacturing a semiconductor integrated circuit device comprising steps of:

(a) forming a first pattern over a first portion of a substrate;

(b) forming a second pattern over a second portion of said substrate;

(c) forming a first side wall on a side surface of said first pattern;

(d) forming a second side wall on a side surface of said second pattern such that a width of said first side wall is greater than a width of said second side wall;

(e) forming a first groove, in said substrate, in self-alignment with said first side wall;

(f) forming a second groove, in said substrate, in self-alignment with said second side wall; and (g) burying said first and said second groove with an insulating film.

28. A method according to claim 23, wherein said first portion is an active area for a MISFET constituting a logic circuit, and wherein said second portion is an active area for a MISFET constituting a memory cell.

* * * * *